United States Patent
Huai et al.

(10) Patent No.: US 8,772,886 B2
(45) Date of Patent: Jul. 8, 2014

(54) SPIN TRANSFER TORQUE MAGNETIC RANDOM ACCESS MEMORY (STTMRAM) HAVING GRADED SYNTHETIC FREE LAYER

(75) Inventors: Yiming Huai, Pleasanton, CA (US); Rajiv Yadav Ranjan, San Jose, CA (US); Ioan Tudosa, Milpitas, CA (US); Roger Klas Malmhall, San Jose, CA (US); Yuchen Zhou, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 10 days.

(21) Appl. No.: 13/099,308

(22) Filed: May 2, 2011

(65) Prior Publication Data
US 2012/0018823 A1    Jan. 26, 2012

Related U.S. Application Data

(60) Provisional application No. 61/367,758, filed on Jul. 26, 2010.

(51) Int. Cl.
| H01L 29/82 | (2006.01) |
| H01L 43/10 | (2006.01) |
| H01F 10/32 | (2006.01) |
| G11C 11/16 | (2006.01) |
| B82Y 25/00 | (2011.01) |
| H01L 43/08 | (2006.01) |
| H01L 43/02 | (2006.01) |

(52) U.S. Cl.
CPC .............. *H01L 43/02* (2013.01); *H01L 43/10* (2013.01); *H01F 10/3272* (2013.01); *H01F 10/3254* (2013.01); *G11C 11/161* (2013.01); *B82Y 25/00* (2013.01); *H01L 43/08* (2013.01)
USPC ........... 257/421; 257/E29.323; 257/E43.001; 257/E43.006; 438/3

(58) Field of Classification Search
USPC ........... 257/421, E29.323, E43.001, E43.006; 438/3
See application file for complete search history.

(56) References Cited

U.S. PATENT DOCUMENTS

| 5,658,659 | A | * | 8/1997 | Chen et al. .................... 428/332 |
| 6,088,196 | A | * | 7/2000 | Tadokoro et al. ......... 360/327.22 |
| 6,146,776 | A | * | 11/2000 | Fukuzawa et al. .......... 428/811.3 |
| 6,165,287 | A | * | 12/2000 | Sato et al. ...................... 148/276 |
| 6,292,389 | B1 | * | 9/2001 | Chen et al. ..................... 365/158 |
| 6,767,655 | B2 | * | 7/2004 | Hiramoto et al. ........... 428/811.2 |
| 6,808,824 | B2 | * | 10/2004 | Tanahashi et al. .......... 428/828.1 |
| 7,271,698 | B2 | * | 9/2007 | Mori et al. ................... 338/32 R |
| 7,985,994 | B2 | * | 7/2011 | Zheng et al. ................... 257/295 |
| 8,129,806 | B2 | * | 3/2012 | Nam et al. ..................... 257/421 |

(Continued)

*Primary Examiner* — Lex Malsawma
*Assistant Examiner* — Sheng Zhu
(74) *Attorney, Agent, or Firm* — Maryam Imam; Bing K Yen

(57) ABSTRACT

A spin transfer torque memory random access memory (STT-MRAM) element is capable of switching states when electrical current is applied thereto for storing data and includes the following layers. An anti-ferromagnetic layer, a fixed layer formed on top of the anti-ferromagnetic layer, a barrier layer formed on top of the second magnetic layer of the fixed layer, and a free layer including a first magnetic layer formed on top of the barrier layer, a second magnetic layer formed on top of the first magnetic layer, a non-magnetic insulating layer formed on top of the second magnetic layer and a third magnetic layer formed on top of the non-magnetic insulating layer. A capping layer is formed on top of the non-magnetic insulating layer.

16 Claims, 15 Drawing Sheets

(56) References Cited

U.S. PATENT DOCUMENTS

| | | |
|---|---|---|
| 2009/0080124 A1* | 3/2009 | Yoshikawa et al. ...... 360/324.12 |
| 2009/0161267 A1* | 6/2009 | Kawai et al. ............... 360/324.2 |
| 2009/0256220 A1* | 10/2009 | Horng et al. .................. 257/421 |
| 2010/0271870 A1* | 10/2010 | Zheng et al. .................. 365/171 |
| 2011/0133298 A1* | 6/2011 | Chen et al. .................... 257/421 |
| 2011/0227179 A1* | 9/2011 | Kitagawa et al. ............. 257/421 |

\* cited by examiner

US 8,772,886 B2

SPIN TRANSFER TORQUE MAGNETIC RANDOM ACCESS MEMORY (STTMRAM) HAVING GRADED SYNTHETIC FREE LAYER

CROSS REFERENCE TO RELATED APPLICATIONS

This application claims priority to U.S. Provisional Patent Application No. 61/367,758, filed on Jul. 26, 2010 by Rajiv Yadav Ranjan and entitled "Spin-Transfer Torque Magnetic Random Access Memory (SSTMRAM) Having Graded Laminated Free Layer".

BACKGROUND OF THE INVENTION

1. Field of the Invention

The present invention relates generally to a spin transfer torque magnetic random access memory (STTMRAM) element, and, more particularly, to an STTMRAM element having a laminated synthetic graded free layer.

2. Description of the Prior Art

Spin transfer torque magnetic random access memory (STTMRAM) is one of the next generations of non-volatile memory currently under development. In STTMRAM, writing magnetic bits is achieved by using a spin polarized current through the magnetic tunnel junction (MTJ), instead of using a magnetic field. The STTMRAM write current scales down with smaller MTJ size in future technology nodes. STTMRAM has significant advantages over the recently-commercialized magnetic-field-switched MRAM, making it a viable candidate for replacing MRAM.

However, one of problems currently preventing use of STTMRAMs is reliable storage of data, which occurs by the free layer thereof switching magnetic orientation to save a logic state of '1' or '0'. Thermal stability plays a strong role in affecting switching of the free layer in that the higher thermal stability, the more reliable the switching of the free layer. Otherwise, STTMRAM offers fast read/write speed and has lower voltage requirement and as such is believed to be an ideal candidate for replacing SRAM as an embedded memory, among other foreseeable applications.

An example of a prior art STTMRAM element 1 is shown in FIG. 1. The element 1 is shown to include an underlayer 2 on top of which is shown formed an anti-ferromagnetic layer 3, on top of which is shown formed a magnetic layer 4, on top of which is shown formed an AF coupling layer 5, on top of which is shown formed a magnetic layer 6, on top of which is shown formed a barrier layer 7, on top of which is shown formed a magnetic layer 8, on top of which is shown formed a capping layer 9. The element 1, as do other prior art STTMRAM elements, suffers from low thermal stability, which adversely affects the switching behavior thereof.

What is needed is a STTMRAM element with improved thermal stability while maintaining ease of switching the magnetization state thereof with an electrical current.

IN THE DRAWINGS

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a spin transfer torque magnetic random access memory (STTMRAM) element includes a selected magnetic tunnel junction (MTJ). Each MTJ is generally configured to have a free layer, and a fixed layer, with a barrier layer disposed between said free layer and said fixed layer. Each of the free and fixed layers has independent magnetic orientations. The MTJ may be written to, or programmed, upon application of a current sufficient to switch the state of the selected MTJ's free layer. The MTJ may thereby represent two different logical states, depending on the orientation of the free layer and fixed layer relative to each other, which changes the resistance to switching current passed through the MTJ during a read/write cycle. The free layer of the MTJ is a graded synthetic layer which is in effect the net demagnetizing field and thereby requires a reduced switching current during programming (or writing) operations.

Figure 2:
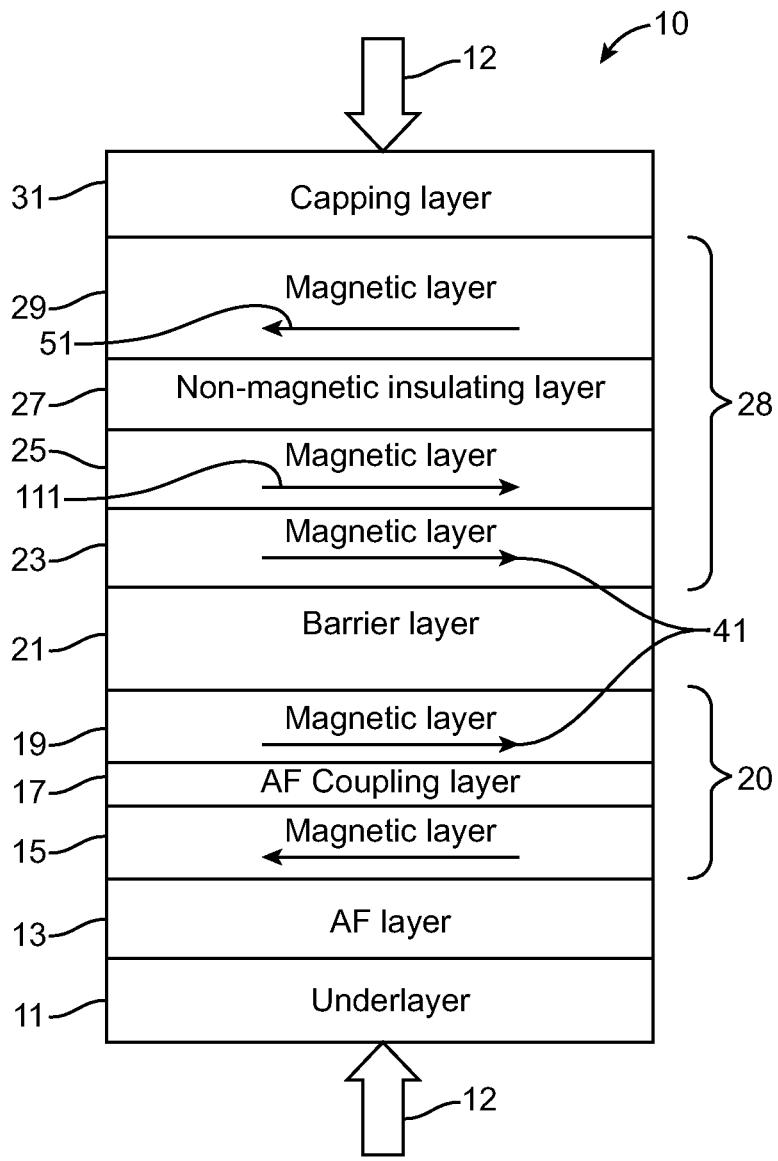
FIG. 2 shows the relevant portions of a STTMRAM element, in accordance with an embodiment of the present invention.

Referring now to FIG. 2, the relevant portion of a STTMRAM element 10 is shown in accordance with an embodiment of the present invention. In the embodiment of FIG. 2, current may be applied to the capping layer 31 and through the MTJ to underlayer 11, or, alternatively, to underlayer 11 and through the MTJ to capping layer 31.

STTMRAM element 10 is shown to comprise underlayer 11, anti-ferromagnetic (AF) layer 13, magnetic layer 15, anti-ferromagnetic coupling layer 17, magnetic layer 19, barrier layer 21, magnetic layer 23, magnetic layer 25, non-magnetic insulating layer 27, magnetic layer 29, and capping layer 31. Underlayer 11 may be formed upon a substrate (not shown), upon which is formed anti-ferromagnetic (AF) layer 13, upon which is formed magnetic layer 15, upon which is formed anti-ferromagnetic coupling layer 17, upon which is formed magnetic layer 19, upon which is formed barrier layer 21, upon which is formed magnetic layer 23, upon which is formed magnetic layer 25, upon which is formed non-magnetic insulating layer 27, upon which is formed magnetic layer 29, and upon which is formed capping layer 31.

Magnetic layer 15, anti-ferromagnetic coupling layer 17, and magnetic layer 19 together comprise fixed layer 20. Magnetic layer 23, magnetic layer 25, non-magnetic layer 27, and magnetic layer 29 together comprise free layer 28. Fixed layer 20, barrier layer 21 and free layer 28 collectively form an MTJ. Fixed layer 20 and free layer 28 are physically not in contact with one another by the use of the barrier layer 21, which serves to separate the fixed and free layer, thus, the fixed and free layers are magnetically isolated from each other.

It is noted that "fixed layer" is commonly referred to as "pinned layer" or "reference layer" and "free layer" is commonly referred to as "switching layer" and "capping layer" is commonly referred to as "cap layer".

Some of the layers of the element 10 have magnetic orientations, as shown by the arrows. In particular, the layers 15, 19, 23, 25 and 29 each are shown to have a magnetic orientation. The magnetic orientation of the fixed layer 20 is fixed while the magnetic orientation of the free layer 28 switches when electrical current is applied at either the underlayer 11 or the capping layer 31, as shown by the arrows 12, and flows through the element 10. While not shown in all subsequent figures, it is understood that during operation of any of the embodiments shown and discussed herein, electrical current is applied either at the bottom or at the top of the element and flows through the element to cause switching of the free layer thereof.

The magnetic orientation of the layer 15 is shown to be in opposite to that of the layer 19 for reasons described below. The magnetic orientation of the layers 23 and 25 are shown to be in the same direction and the magnetic orientation of the layer 29 is opposed to that of the layers 23 and 25.

Barrier layer 21 generates magneto-resistance, i.e. the resistance across the element 10 that changes when magnetization of the layer 23 changes relative to the magnetization of the layer 19. Varying the thickness of barrier layer 21 typically affects the resistance of STTMRAM element 10, and the amount of current necessary to perform a read or write operation on STTMRAM element 10.

Barrier layer 21 is typically made of a substantially non-magnetic material. For example, barrier layer 21 is typically made of dielectric material such as ruthenium oxide (RuO), strontium oxide (SrO), zink oxide ($ZnO_2$), magnesium oxide (MgO), zirconium oxide ($ZrO_2$), aluminum oxide ($Al_2O_3$), or titanium oxide ($TiO_2$). Barrier layer 21 may be either an amorphous non-magnetic alloy or a crystalline non-magnetic alloy.

In an alternative embodiment, a very thin layer of Mg, or another constituent element, for example, of a thickness 1 nanometers (nm) or less, may be deposited upon magnetic layer 19 prior to the deposition of barrier layer 21 to prevent the non-magnetic barrier layer 21 from intermixing with the magnetic layer 19, which may cause oxygen ions of the barrier layer to interact with cobolt (Co) and/or iron (Fe) atoms forming oxides which can reduce the tunneling magneto-resistance and increase the resistance-area product (RA).

Underlayer 11 is metallic and conducive to the passage of current through STTMRAM element 10. Underlayer 11 may be formed upon a bottom electrode or upon a substrate or film. Underlayer 11, in some embodiments, is comprised of non-magnetic alloys, and in other embodiments, may be made of magnetic alloys. The underlayer 11 serves to provide a crystalline structure or lattice for growing an effective anti-ferromagnetic layer (AF) 13. Underlayer 11, in some embodiments, is an alloy selected from one or more of the following materials: tantalum (Ta), chromium (Cr), titanium (Ti), molybdenum (Mo), tungsten (W), boron (B), copper (Cu), nitrogen (N), nickel (Ni), carbon (C), phosphorus (P), iron (Fe), or cobalt (Co).

Capping layer 31 is made of a metallic material, in some embodiments, and is conductive to the passage of current through the STTMRAM element 10. Capping layer 31 is formed upon magnetic layer 29 and in some embodiments, is comprised of non-magnetic alloys, and in other embodiments, it is comprised of magnetic alloys. In some embodiments, capping layer 31 is made of an alloy selected from one or more of the following materials: tantalum (Ta), chromium (Cr), tungsten (W), titanium (Ti), zirconium (Zr), niobium (Nb), copper (Cu), or aluminum (Al). In an embodiment of the present invention, capping layer 31 is approximately 2 nanometers (nm) to 100 nm thick.

STTMRAM element 10 may be read or written by passing switching (electrical) current through each of the layers of STTMRAM element 10. Switching current may be passed from capping layer 31, through STTMRAM element 10, to underlayer 11; or current may be passed from underlayer 11, through STTMRAM element 10, to capping layer 31.

Magnetic layer 15 is generally a ferromagnetic layer having a fixed magnetic orientation, as noted above, such that its magnetic orientation may not be reversed by neighboring magnetic fields or the passage of read or write current through STTMRAM element 10. The magnetic orientation of magnetic layer 15 is fixed and is realized by a magnetic annealing process following the deposition of all layers comprising STTMRAM element 10. In one method of the present invention, such a process involves heating a wafer containing at least one STTMRAM element 10 above 350 degrees centigrade, under application of a substantially uniaxial magnetic field of over 0.5 Tesla (5 kG), for two or more hours. Such an annealing process may also induce crystallization of the magnetic layers 23, 25, and 27.

In an embodiment of the present invention, magnetic layer 15 is comprised of an alloy of one or more of the following materials: iron (Fe), nickel (Ni), cobalt (Co), platinum (Pt), copper (Cu), boron (B), tantalum (Ta), titanium (Ti), chromium (Cr), niobium (Nb), vanadium (V), zirconium (Zr), terbium (Tb), samarium (Sm), neodymium (Nd), and gadolinium (Gd). Magnetic layer 15 may also be comprised of one or more of silicon dioxide ($SiO_2$), titanium dioxide ($TiO_2$), tantalum oxide ($Ta_2O_5$), or aluminum oxide ($Al_2O_3$).

In an embodiment of the present invention, magnetic layer 15 is about 0.5 nm to 5 nano meters (nm) thick.

In an embodiment of the present invention, magnetic layer 19 is substantially similar to magnetic layer 15 in that magnetic layer 19 is analogous to magnetic layer 15 in composition and thickness. However, in accordance with an embodiment of the present invention, magnetic layer 19 has a magnetic orientation that is anti-parallel to the magnetic orientation of magnetic layer 15, as shown by the direction of the arrow 41. In one embodiment, the layer 15 is made of $Co_{70}Fe_{30}$ alloy and is 2.5 nm thick, and the layer 19 is comprised of a $Co_{40}Fe_{40}B_{20}$ and is 3.0 nm thick.

Magnetic layer 19 has a fixed magnetic orientation, which, in some embodiments, is equal and opposite to the fixed magnetic orientation of magnetic layer 15. Magnetic layers 15 and 19 are configured in an anti-parallel magnetic orientation to minimize the force of an external magnetic field on free layer 28. Eliminating any magnetic field from fixed layer 20 is important to the consistent operation of STTMRAM element 10. A magnetic field created by fixed layer 20 may have negative effects on the operation of free layer 28. For example, a magnetic field originating from fixed layer 20 and biased in a single orientation may cause the magnetic layers of free layer 28 to switch much more easily into one state than the other. In such a situation, asymmetric currents may be needed to read or write STTMRAM element 10, depending on whether STTMRAM element 10 is in a '1' or a '0' state, thereby increasing the complexity of the read and write circuitry. Additionally, a free layer 28 under the constant effects of a magnetic field from fixed layer 20 may more easily and inadvertently switch states, thus corrupting the integrity of the stored values in memory. Still further, a magnetic field created by fixed layer 20 may have similar adverse effects upon both the free and fixed layers of neighboring MTJs.

Anti-ferromagnetic layer 13 and anti-ferromagnetic coupling layer 17 assist to permanently fix the magnetic orientations of magnetic layers 15 and 19 in their respective orientations. Magnetic layers 15 and 19 are discussed in more depth above. In accordance with an embodiment of the present invention, the anti-ferromagnetic layer 13 is comprised of one or more of the following: iridium manganese (IrMn), platinum manganese (PtMn), nickel manganese (NiMn), and iron manganese (FeMn).

Anti-ferromagnetic layer 13 assists to pin the magnetic orientation of magnetic layer 15, and anti-ferromagnetic coupling layer 17 assists to pin the magnetic orientations of both magnetic layers 15 and 19. Further, anti-ferromagnetic coupling layer 17 physically separates magnetic layer 15 from magnetic layer 19. Continuity between magnetic layers 15 and 19 (i.e., magnetic layer 19 formed directly upon magnetic layer 15) may make it impossible, or prohibitively difficult, to induce magnetic orientations between magnetic layers 15 and 19 which are anti-parallel. Thus, anti-ferromagnetic coupling layer 17 also provides a structure upon which magnetic layer 19 may be successfully formed with a magnetic orientation that is anti-parallel to the magnetic orientation of magnetic layer 15.

In accordance with an embodiment of the present invention, anti-ferromagnetic layers 13 and 17 each have a thickness of about 0.5 nm to 50 nm. Generally, anti-ferromagnetic layer 13 is thicker than anti-ferromagnetic coupling layer 17.

Together, magnetic layer 15, anti-ferromagnetic coupling layer 17, and magnetic layer 19 comprise fixed layer 20. The magnetic orientations of the individual layers of fixed layer 20 are static, and are not affected by the application of read or write current to STTMRAM element 10.

Magnetic layer 23, magnetic layer 25, and magnetic layer 29 are each ferromagnetic layers with a non-fixed or switchable magnetic orientation. The magnetic orientations of each of magnetic layers 23, 25 and 29 are indicated by arrows in each of the layers of FIG. 2 (arrow 51 shows the direction of magnetization of the layer 29 and arrow 111 shows the direction of magnetization of the layer 25). Specifically, the right-pointing arrows of magnetic layers 23 and 25 indicate that these two magnetic layers have the same magnetization direction while the left-pointing arrow of magnetic layer 29 indicates that its magnetic orientation is anti-parallel to the orientation of magnetic layers 23 and 25. These magnetic orientations are not fixed, and are capable of being reversed upon application of sufficient current, commonly referred to as switching current, to STTMRAM element 10. In other words, if STTMRAM element 10 were to be storing a bit value of, or logic state, '0' in FIG. 2, application of a switching current would cause the magnetic orientations of each of magnetic layers 23, 25, and 29 to reverse, and STTMRAM element 10 would then store a bit value of '1'.

In some embodiments, magnetic layers 23, 25, and 29 are each comprised of an alloy selected from the following: iron (Fe), nickel (Ni), cobalt (Co), platinum (Pt), copper (Cu), boron (B), tantalum (Ta), titanium (Ti), chromium (Cr), terbium (Tb), samarium (Sm), neodymium (Nd), and gadolinium (Gd). Magnetic layer 23, 25, and 29 may also be comprised of one or more of silicon dioxide (SiO2), titanium dioxide (TiO2), magnesium oxide (MgO), tantalum oxide (Ta2O5), and aluminum oxide (Al2O3). In accordance with an embodiment of the present invention, magnetic layers 23, 25, and 29 are each alloys of cobolt-iron-boron (CoFeB).

In accordance with an embodiment of the present invention, magnetic layer 23 and magnetic layer 25 may differ from each other in both composition and thickness. The alloy of which magnetic layer 25 is comprised may affect the structure of non-magnetic insulating layer 27 formed thereon.

Free layer 28 is considered to be a graded synthetic layer because firstly, the magnetic property, e.g. saturation magnetization ($M_s$) of the layers 23 and 25 are chosen such that layer 23 has higher $M_s$ than that of layer 25, secondly the layer 27 helps the magnetization of the layer 29 to be aligned opposite to that of the layers 23 and 25, as marked by the arrows 111, 41 and 51. The foregoing point about the layer 27 helping magnetization is particularly noteworthy because once the STTMRAM element is formed, the magnetic orientations of the layers 23, 25 and 29 are more stable due to magneto-static coupling between the layers 23 and 25 and the layer 29 as opposed to prior art magnetic memory elements where only one magnetic layer is used with a single direction of magnetization.

With magnetic layers 23 and 25 being magnetically coupled through exchange coupling, the net magnetic orientation of the combined layers 23 and 25 is kept nearly equal to the net orientation of the layer 29, whose magnetic orientation is oppositely oriented to that of layers 23 and 25. The net effect is that the overall magnetic field of free layer 28 of STTMRAM element 10 is balanced and lower than prior art MTJs. The affect of this configuration, wherein magnetic layer 29 is oriented anti-parallel to magnetic layers 23 and 25, balances the net magnetic field of free layer 28 and mitigates any magnetic forces on adjacent structures, similar to configuration of magnetic layers 15 and 19 of fixed layer 20 below barrier layer 21.

Balancing the net magnetic fields of both free layer 28 and fixed layer 20 of STTMRAM element 10 allows for closer spacing between the adjacent MTJs 10 of a memory element, because the chance of inadvertent free layer switching is reduced. Thus, the density, and consequently capacity, of memory elements and therefore memory cells (memory elements and respective access transistor) is increased with no substantial impact upon memory integrity.

In some embodiments, magnetic layers 23, 25, and 29 each have a different saturation magnetization ($M_s$). For example, in accordance with an embodiment of the present invention, magnetic layer 23 is comprised of CoFeB, while magnetic layer 25 is comprised of CoFeBx where 'x' is one or more of Ta, Cr, Nb, V and Ti, which has a reduced $M_s$. Generally, magnetic layer 23 has an $M_s$ of 1100 to 1600 emu/cm$^3$, magnetic layer 25 has an $M_s$ of 600 to 900 emu/cm$^3$, and magnetic layer 29 has an $M_s$ of 1100 to 1600 emu/cm$^3$. In a yet another embodiment, the magnetic layer 23 is made of iron, Fe, having $M_s$ of about 1660 emu/cm$^3$, layer 25 is comprised of CoFeBx alloy having an $M_s$ of about 850 emu/cm$^3$ and the layer 29 is comprised of an alloy of CoFeB having an $M_s$ of about 1400 emu/cm$^3$.

Non-magnetic layer 27 is generally a non-magnetic layer which is conducive to the passage of current. Non-magnetic layer 27 physically isolates magnetic layer 25 from magnetic layer 29, allowing magnetic layers 23 and magnetic layer 25 to share the same magnetic orientation while magnetic layer 29 maintains a magnetic orientation anti-parallel to magnetic layers 23 and 25. Due to the physical separation of magnetic layer 25 from magnetic layer 29, magnetic layer 29 is capable of being formed with a magnetic orientation independent of, and anti-parallel to, the magnetic orientation of magnetic layer 25.

In some embodiments, non-magnetic layer 27 is formed of substantially the same material as barrier layer 21, such as, for example, MgO. In some embodiments, non-magnetic layer 27 is generally thinner than barrier layer 21. In other words, the distance by which magnetic layer 25 and magnetic layer 29 are separated by non-magnetic layer 27 is less than the distance by which magnetic layer 19 and magnetic layer 23 are separated by barrier layer 21. Non-magnetic insulating layer may have a thickness of about 0.2 nm to 2.0 nm.

In accordance with one embodiment of the present invention, magnetic layer 23 comprises an alloy of CoFeB with ruthenium (Ru), and the composition of magnetic layer 25 does not include the presence of ruthenium. The presence of ruthenium in the magnetic layer 25 may cause a non-magnetic insulating layer 27 comprised of MgO to become immiscible with the magnetic layer 25 upon which it is formed. Thus, the lack of ruthenium in magnetic layer 25 may allow for growth of a more defined and better insulating non-magnetic insulating layer 27.

Together, magnetic layer 23, barrier layer 21, magnetic layers 23 and 25, non-magnetic insulating layer 27, and magnetic layer 29 comprise free layer 28. The magnetic layers of free layer 28 are capable of having their magnetic orientations switched upon application of a write (or switching) current, and thus may be used to store a state to STTMRAM element 10.

With regards to the STTMRAM elements of FIGS. 3-8, the free layer of each MTJ (made of a fixed layer, a barrier layer and a free layer) includes a plurality of magnetic layers whereby at least one magnetic layer is oriented anti-parallel to at least one other magnetic layer for balancing and neutralizing the overall magnetic field of the free layer, similar to the effect explained above relative to FIG. 2. Each of FIGS. 3-8 present a slightly unique configuration by which the same ultimate affect is achieved, while advantageously changing the tunneling magneto resistance (TMR), resistivity, resistance area product (RA), anisotropy, or other characteristic(s) of the MTJ.

Figure 3:
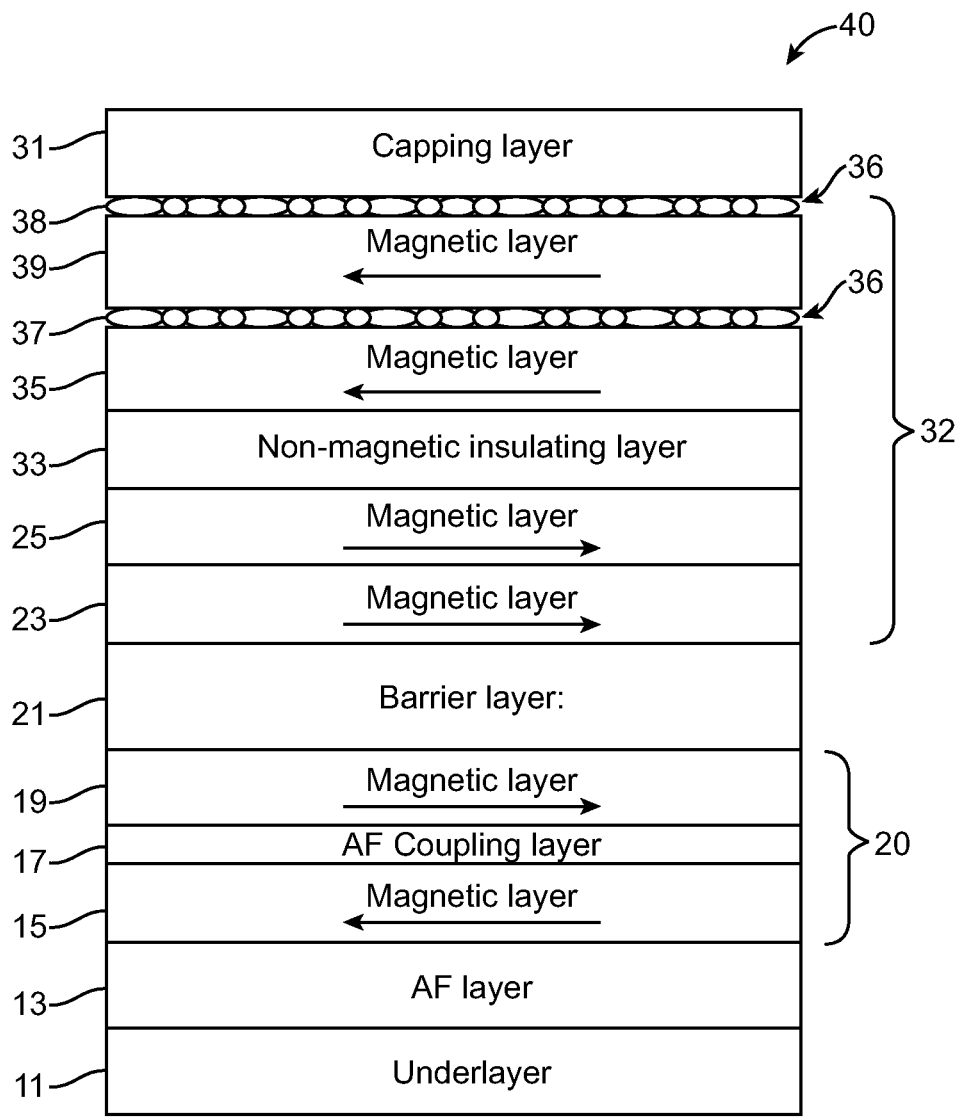
FIG. 3 shows a STTMRAM element with a laminated synthetic free layer 32, in accordance with an embodiment of the present invention.

Referring now to FIG. 3, STTMRAM element 40 is shown having a laminated synthetic free layer 32, in accordance with an embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, magnetic layer 25, and capping layer 31 of STTMRAM element 40 are substantially identical to the same corresponding layers of STTMRAM element 10. STTMRAM element 40 differs from STTMRAM element 10 in the configuration of its free layer 32.

As with STTMRAM element 10, STTMRAM element 40 is shown to include underlayer 11 upon which is formed anti-ferromagnetic layer 13, upon which is formed magnetic layer 15, upon which is formed anti-ferromagnetic coupling layer 17, upon which is formed magnetic layer 19, upon which is formed barrier layer 21. Upon barrier layer 21 is formed free layer 32, which includes forming magnetic layer 23 upon barrier layer 21, magnetic layer 25 formed upon magnetic layer 23, non-magnetic insulating layer 33 formed upon magnetic layer 25, laminate layer 37 formed upon magnetic layer 35, magnetic layer 39 formed upon laminate layer 37, laminate layer 36 formed upon magnetic layer 39, and capping layer 31 formed upon laminate layer 38.

The magnetic layers 35 and 39, together with laminate layers 37 and 38, perform the same magnetic field balancing function of magnetic layer 29 of free layer 28 of STTMRAM element 10. As shown in FIG. 3 magnetic layers 35 and 39 of STTMRAM element 40 share the same magnetic orientation (left-pointing arrows). Similarly, magnetic layers 23 and 25 share a magnetic orientation (right-pointing arrows). The magnetic orientation of magnetic layers 23 and 25 is anti-parallel to the magnetic orientation of magnetic layers 35 and 39. In some embodiments, the magnitude of the magnetic field created by magnetic layers 35 and 39 are equal and opposite to the magnitude of the magnetic field created by magnetic layers 23 and 35, balancing out for little or no net magnetic field around free layer 32 of STTMRAM element 40. In an embodiment of the present invention, magnetic layers 35 and 39 are comprised of substantially the same material used for forming magnetic layer 29. Magnetic layer 39 and magnetic layer 35 may be substantially the same thickness, or one of magnetic layers 35 or 39 may be thicker than the other, causing each magnetic layer to have a different $M_s$.

Upon magnetic layer 35 is formed laminate layer 37, upon which is formed magnetic layer 39, upon which is formed laminate layer 36. Laminate layers 36 and 37 are each comprised of one or more of the non-magnetic materials namely, titanium dioxide (TiO$_2$), oxide (Al$_2$O$_3$), rhodium oxide (RuO), strontium oxide (SrO), zinc oxide (ZnO), magnesium oxide (MgO), zirconium dioxide (ZrO$_2$), titanium (Ti), tantalum (Ta), rhodium (Ru), magnesium (Mg), chromium (Cr), niobium (Nb), nickel niobium (NiNb). Laminate layers 36 and 37 lower the overall demagnetizing field of free layer 32 and thereby the switching current required to switch the magnetic orientation of the free layer, making it suitable and advantageous for use in lower cost and higher density memory products.

As in the embodiment of FIG. 2, free layer 32 is a graded synthetic layer because typically the layer 23 has a higher magnetic orientation density, Ms, than that of the layer 25. While this refers to a monotonic grading, i.e., the saturation magnetization is reduced for each subsequent layers. There are situations where the Ms can first increase then decrease after a few layers, and vice versa. In the most general sense, the term "graded" as used herein refers to varying Ms of different layers.

Non-magnetic insulating layer 33 may be identical to non-magnetic insulating layer 27 of STTMRAM element 10 of FIG. 2 with regards to composition, thickness, and function.

Figure 4:
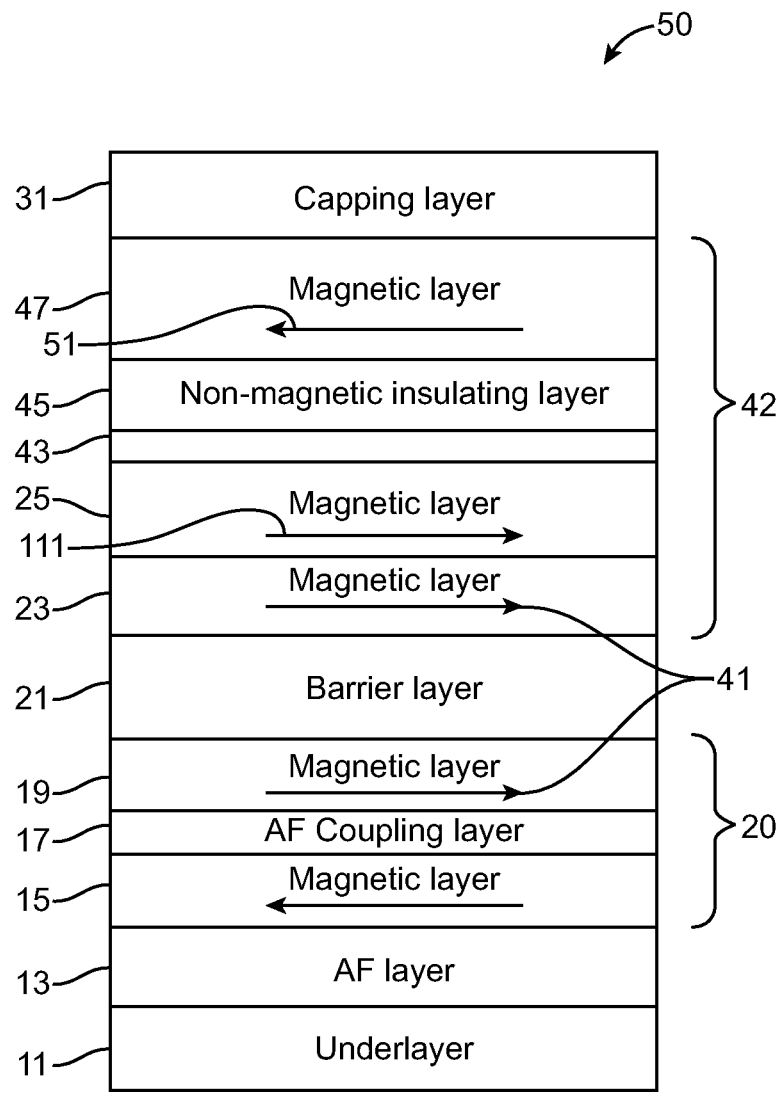
FIG. 4 shows a STTMRAM element with a partially oxidized synthetic free layer 42, in accordance with an embodiment of the present invention.

Referring now to FIG. 4, STTMRAM element 50 is shown with a partially oxidized free layer 42, in accordance with an embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, and magnetic layer 25 of STTMRAM element 50 are analogous to the same corresponding layers of STTMRAM element 10. STTMRAM element 50 differs from STTMRAM element 10 in the configuration of its free layer 42.

Free layer 42, is partially oxidized in some embodiments of the present invention and is made of comprises magnetic layer 23, magnetic layer 25, oxidized region 43, non-magnetic insulating layer 45, and magnetic layer 47. Magnetic layer 23 is formed upon barrier layer 21, and upon magnetic layer 23 is formed magnetic layer 25, upon which is formed oxidized region 43, upon which is formed non-magnetic insulating layer 45, upon which is formed magnetic layer 47, upon which is formed capping layer 31.

The magnetic layer 47 of free layer 42 performs the same magnetic field balancing function of magnetic layer 29 of free layer 28 of STTMRAM element 10. As shown in FIG. 3 magnetic layer 47 has a magnetic orientation (left-pointing arrow) different than the other layers of free layer 42. Magnetic layers 23 and 25 share a magnetic orientation (right-pointing arrows). The magnetic orientation of magnetic layers 23 and 25 is anti-parallel to the magnetic orientation of magnetic layer 47. In some embodiments, the magnitude of the magnetic field generated by magnetic layer 47 are equal and opposite to the magnitude of the magnetic field generated by magnetic layers 23 and 35, balancing out for little or no net magnetic field around free layer 42 of STTMRAM element 50. Magnetic layer 47 may be comprised of substantially the same material used for forming magnetic layer 29. In accordance with some embodiments of the present invention, magnetic layer 47 are substantially the same thickness as magnetic layers 23 and 25 combined, or magnetic layer 47 are thicker or thinner than magnetic layers 23 and 25 combined, contributing to each of the magnetic layers of free layer 42 having a different $M_s$.

In accordance with a method of the present invention, the process of manufacturing the relevant layers of free layer 42 of STTMRAM element 50 proceeds as follows: After deposition of magnetic layer 25 upon magnetic layer 23, the uncovered magnetic layer 25 is temporarily exposed to an oxidizing gas which oxidizes a portion of magnetic layer 25. Non-magnetic insulating layer 45 is then deposited upon oxidized region 43, upon which is deposited magnetic layer 47, and then capping layer 31.

Oxidized region 43 is comprised of the alloy which comprises magnetic layer 25, after being subjected to a reactive oxygen-containing gas. Oxidized region 43 lowers the overall demagnetizing field of free layer 42, making it suitable and advantageous for use in lower cost higher density memory product.

In some embodiments of the present invention, non-magnetic insulating layer 45 is analogous to non-magnetic insulating layer 27 of STTMRAM element 10 of FIG. 2 with regards to composition, thickness, and function.

Figure 1:
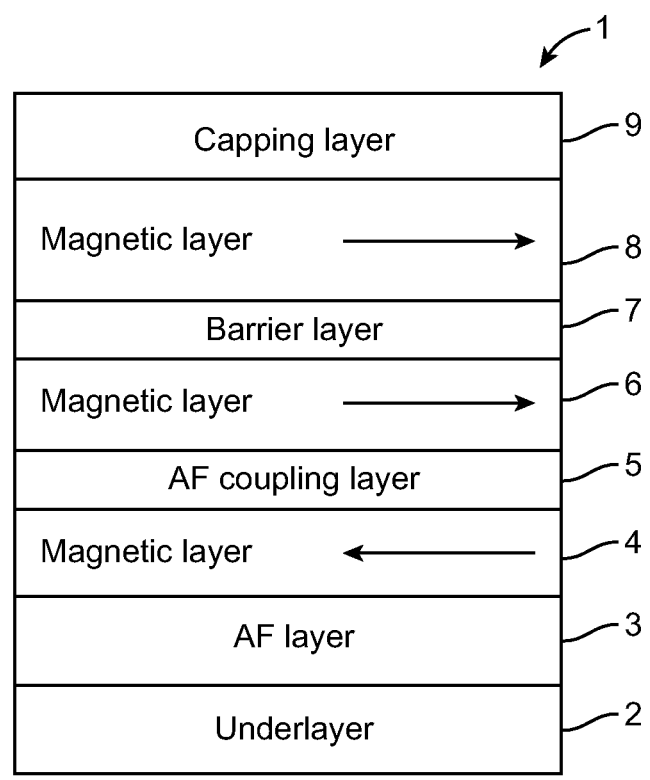
FIG. 1 shows a prior art STTMRAM element.

As in the embodiments of FIGS. 1 and 2, free layer 42 is a graded synthetic layer.

Figure 5:
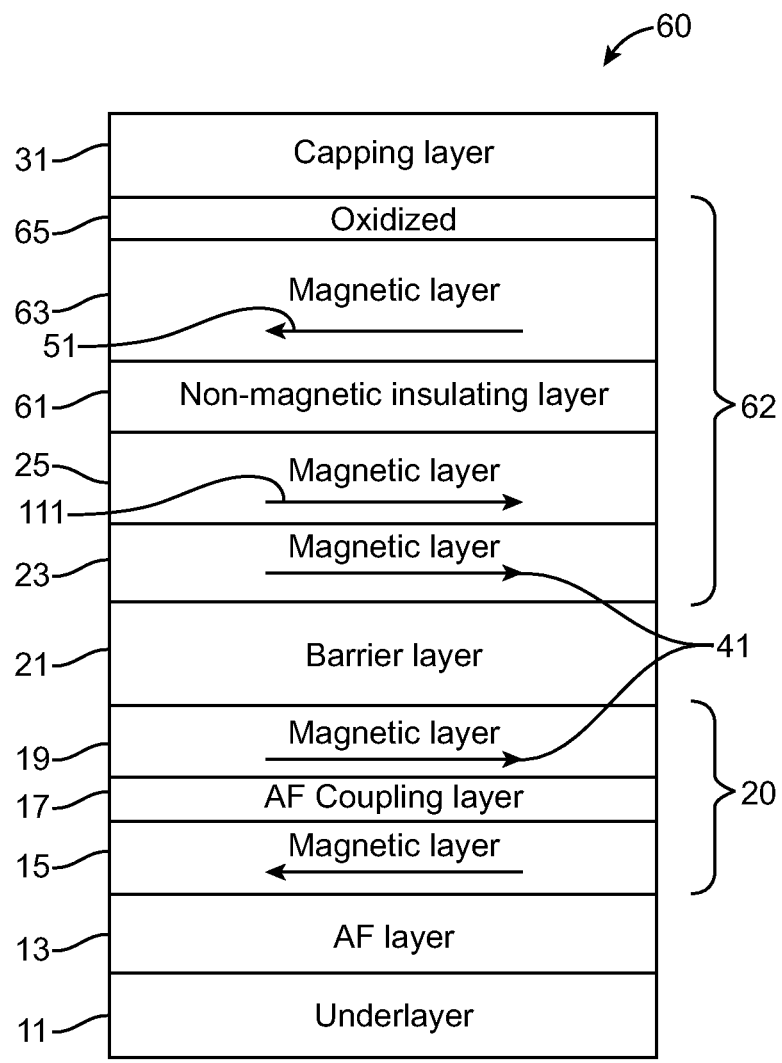
FIG. 5 shows a STTMRAM element with a partially oxidized synthetic free layer 62, in accordance with an embodiment of the present invention.

Referring now to FIG. 5, STTMRAM element 60 is shown with a partially oxidized free layer 62, in accordance with an alternative embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, and magnetic layer 25 of STTMRAM element 60 are substantially identical to the same corresponding layers of STTMRAM element 10. STTMRAM element 60 differs from STTMRAM element 10 in the configuration of its free layer 62.

Free layer 62 comprises magnetic layer 23, magnetic layer 25, non-magnetic insulating layer 61, magnetic layer 63, and oxidized region 65. Magnetic layer 23 is formed upon barrier layer 21, and upon magnetic layer 23 is formed magnetic layer 25, upon which is formed non-magnetic insulating layer 61, upon which is formed magnetic layer 63, upon which is formed oxidized region 65, and upon which is formed capping layer 31.

The magnetic layer 63 of free layer 62 performs the same magnetic field balancing function of magnetic layer 29 of free layer 28 of STTMRAM element 10. As shown in FIG. 5, magnetic layer 63 has a magnetic orientation (left-pointing arrow) different than the other layers of free layer 62. Magnetic layers 23 and 25 share a magnetic orientation (right-pointing arrows). The magnetic orientation of magnetic layers 23 and 25 is anti-parallel to the magnetic orientation of magnetic layer 63. The magnitude of the magnetic field generated by magnetic layer 63 may be equal and opposite to the magnitude of the magnetic field generated by magnetic layers 23 and 35, balancing out for little or no net magnetic field around free layer 62 of MTJ 60. Magnetic layer 63 may be comprised of substantially the same material used for forming magnetic layer 29. Magnetic layer 63 may be substantially the same thickness as magnetic layers 23 and 25 combined, or magnetic layer 63 may be thicker or thinner than magnetic layers 23 and 25 combined, contributing to each of the magnetic layers of free layer 62 having a different Ms.

The process of manufacturing the relevant layers of free layer 62 of MTJ 60 may proceed as follows: After deposition of magnetic layer 63 upon non-magnetic insulating layer 61, the uncovered magnetic layer 63 may be temporarily exposed to an oxidizing gas which oxidizes a portion of magnetic layer 63. Capping layer 31 is then deposited upon oxidized region 65.

Oxidized region 65 is comprised of the alloy which comprises magnetic layer 63, after being subjected to a reactive oxygen-containing gas. Oxidized region 65 lowers the overall demagnetizing field of free layer 42, making it suitable and advantageous for use in lower cost higher density memory product.

Non-magnetic insulating layer 61 may be identical to non-magnetic insulating layer 27 of STTMRAM element 10 of FIG. 2 with regards to composition, thickness, and function.

Figure 6:
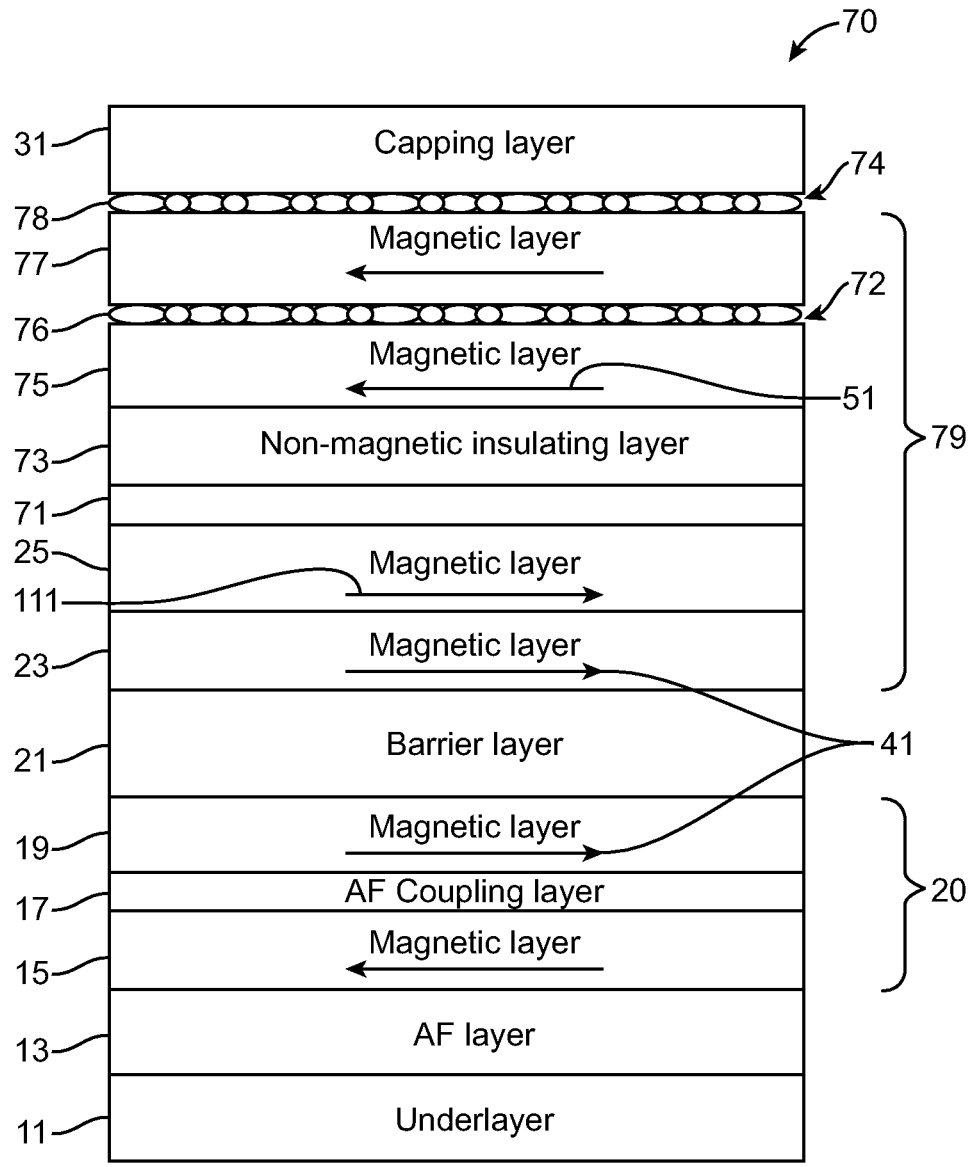
FIG. 6 shows a STTMRAM element with a partially oxidized and laminated synthetic free layer 79, in accordance with an embodiment of the present invention.

Referring now to FIG. 6, STTMRAM element 70 is shown with a partially oxidized and laminated free layer 79, in accordance with an embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, and magnetic layer 25 of STTMRAM element 70 are substantially identical to the same corresponding layers of STTMRAM element 10. STTMRAM element 70 differs from STTMRAM element 10 in the configuration of its free layer 79.

Free layer 79 comprises magnetic layer 23, magnetic layer 25, oxidized region 71, non-magnetic insulating layer 73, magnetic layer 75, laminate layer 72, and magnetic layer 77.

Magnetic layer 23 is formed upon barrier layer 21, and upon magnetic layer 23 is formed magnetic layer 25, upon which is formed oxidized region 71, upon which is formed non-magnetic insulating layer 73, upon which is formed magnetic layer 75, upon which is formed laminate layer 72, upon which is formed magnetic layer 77, upon which is formed laminate layer 74, upon which is formed capping layer 31.

Free layers of each of the embodiments of FIGS. 5-8 are graded synthetic.

The magnetic layers 75 and 77 of free layer 79 serve to create an analogous magnetic field balancing as that of magnetic layer 29 of free layer 28 of STTMRAM element 10. As shown in FIG. 6, magnetic layers 75 and 77 share a magnetic orientation (left-pointing arrows). Magnetic layers 23 and 25 also share a magnetic orientation (right-pointing arrows). The magnetic orientation of magnetic layers 23 and 25 is anti-parallel to the magnetic orientation of magnetic layers 75 and 77.

In some embodiments, the magnitude of the magnetic field generated by magnetic layers 75 and 77 is equal and opposite to the magnitude of the magnetic field generated by magnetic layers 23 and 35, balancing out for little or no net magnetic field around free layer 79 of STTMRAM element 70. Magnetic layers 75 and 77 may be comprised of substantially the same material used for forming magnetic layer 29. Each of magnetic layers 75 and 77 may be substantially the same thickness as one of the corresponding magnetic layers 23 and 25. Alternatively, each of magnetic layers 75 and 77 may be sized to have a thickness not substantially similar to either of magnetic layer 23 or magnetic layer 25, contributing to each of the magnetic layers of free layer 79 having a different Ms.

In accordance with a method of the present invention, the process of manufacturing the relevant layers of free layer 79 of STTMRAM element 70 proceeds as follows: After deposition of magnetic layer 25 upon magnetic layer 23, the uncovered magnetic layer 25 are temporarily exposed to an oxidizing gas which oxidizes an upper portion of magnetic layer 25, forming oxidized region 71. Non-magnetic insulating layer 73 is then formed upon oxidized region 71, magnetic layer 75 is formed upon non-magnetic insulating layer 73, laminate layer 72 is formed upon magnetic layer 75, magnetic layer 77 is formed upon laminate layer 72, laminate layer 74 is formed upon magnetic layer 77, and capping layer 31 is formed upon laminate layer 74.

Oxidized region 71 is comprised of the alloy which comprises magnetic layer 25, after being subjected to a reactive oxygen-containing gas. Oxidized region 71 lowers the overall demagnetizing field of free layer 79, making MTJ 79 suitable and advantageous for use in lower cost higher density memory product. On top of magnetic layer 75 is formed laminate layer 76, upon which is formed magnetic layer 77, upon which is formed laminate layer 78. Laminate layers 76 and 78 are each comprised of one or more of the non-magnetic materials namely, TiO2, Al2O3, RuO, SrO, ZnO, MgO, ZrO2, Ti, Ta, Ru, Mg, Cr, Nb, or NiNb. Laminate layers 76 and 78 lower the overall demagnetizing field of free layer 79 and thereby the switching current, making it suitable and advantageous for use in lower cost and higher density memory product. Together, oxidized region 71, laminate layer 72, and laminate layer 74 of free layer 79, lower the overall demagnetizing field of making MTJ 70 an advantageous alternative to STTMRAM element 10, shown in FIG. 2, in certain devices.

Non-magnetic insulating layer 73 may be identical to non-magnetic insulating layer 27 of STTMRAM element 10 of FIG. 2 with regards to composition, thickness, and function.

Figure 7:
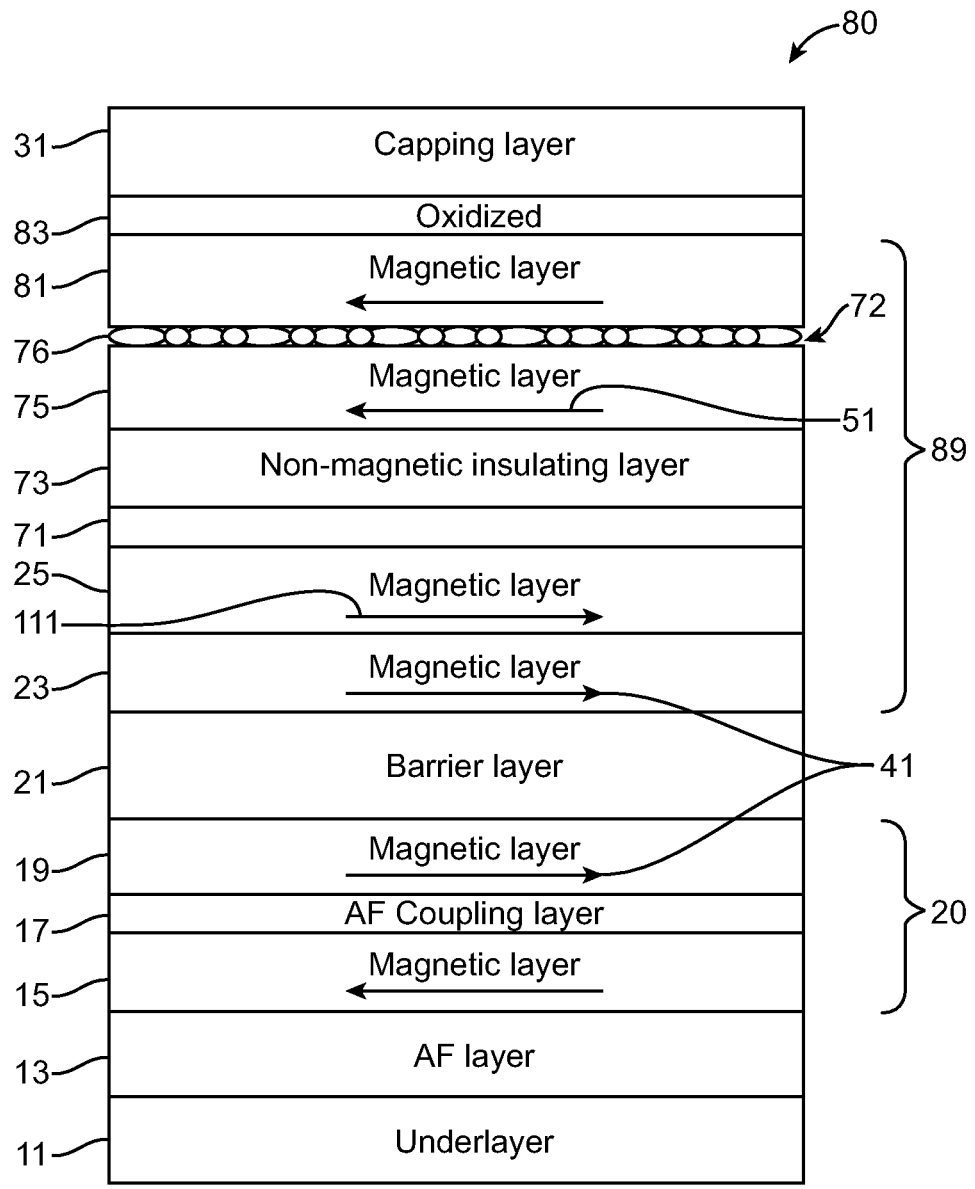
FIG. 7 shows a STTMRAM element with a partially oxidized and laminated synthetic free layer 89, in accordance with an alternative embodiment of the present invention.

Referring now to FIG. 7, STTMRAM element 80 is shown with a partially oxidized and laminated free layer 89, in accordance with an embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, and magnetic layer 25 of STTMRAM element 80 are substantially identical to the same corresponding layers of STTMRAM element 10. STTMRAM element 80 differs from STTMRAM element 10 in the configuration of its free layer 89.

Free layer 89 comprises magnetic layer 23, magnetic layer 25, oxidized region 71, non-magnetic insulating layer 73, magnetic layer 75, laminate layer 72, and magnetic layer 81. Non-magnetic insulating layer 73 of MTJ 80 is substantially identical to non-magnetic insulating layer 73 of MTJ 70; laminate layer 72 of MTJ 80 is substantially identical to laminate layer 72 of MTJ 70; and magnetic layer 75 of MTJ 80 is substantially identical to magnetic layer 75 of MTJ 70.

Magnetic layer 23 is formed upon barrier layer 21, and upon magnetic layer 23 is formed magnetic layer 25, upon which is formed oxidized region 71, upon which is formed non-magnetic insulating layer 73, upon which is formed magnetic layer 75, upon which is formed laminate layer 72, upon which is formed magnetic layer 81, upon which is formed oxidized region 83, upon which is formed capping layer 31.

The magnetic layers 75 and 81 of free layer 79 perform the same magnetic field balancing function of magnetic layer 29 of free layer 28 of STTMRAM element 10. As shown in FIG. 6, magnetic layers 75 and 81 share a magnetic orientation (left-pointing arrows). Magnetic layers 23 and 25 also share a magnetic orientation (right-pointing arrows). The magnetic orientation of magnetic layers 23 and 25 is anti-parallel to the magnetic orientation of magnetic layers 75 and 81. The magnitude of the magnetic field generated by magnetic layers 75 and 81 may be equal and opposite to the magnitude of the magnetic field generated by magnetic layers 23 and 35, balancing out for little or no net magnetic field around free layer 89 of STTMRAM element 80.

In accordance with an embodiment of the present invention, magnetic layers 75 and 81 are comprised of substantially the same material used for forming magnetic layer 29. In an embodiment of the present invention, each of magnetic layers 75 and 81 is substantially the same thickness as one of the corresponding magnetic layers 23 and 25. Alternatively, each of magnetic layers 75 and 81 is sized to have a thickness not substantially similar to either of magnetic layer 23 or magnetic layer 25, contributing to each of the magnetic layers of free layer 79 having a different Ms.

In accordance with a method of the present invention, the process of manufacturing the relevant layers of free layer 89 of STTMRAM element 80 proceeds as follows: After deposition of magnetic layer 25 upon magnetic layer 23, the uncovered magnetic layer 25 is temporarily exposed to an oxidizing gas which oxidizes an upper portion of magnetic layer 25, forming oxidized region 71. Non-magnetic insulating layer 73 is then formed upon oxidized region 71, magnetic layer 75 is formed upon non-magnetic insulating layer 73, laminate layer 72 is formed upon magnetic layer 75, magnetic layer 81 is formed upon laminate layer 72, magnetic layer 81 may then be temporarily exposed to an oxidizing gas which oxidizes an upper portion of magnetic layer 25, forming oxidized region 83, and capping layer 31 is formed upon oxidized region 83.

Oxidized region 71 is comprised of the alloy which comprises magnetic layer 25, after being subjected to a reactive oxygen-containing gas. Oxidized region 83 is comprised of the alloy which comprises magnetic layer 81, after being subjected to a reactive oxygen-containing gas. Oxidized region 71 and oxidized region 83 may lower the overall demagnetizing field of free layer 79, making it suitable and advantageous for use in lower cost and higher density memory product.

On top of magnetic layer 75 is formed laminate layer 76, upon which is formed magnetic layer 77, upon which is formed laminate layer 78. Laminate layers 76 and 78 are each comprised of one or more of the non-magnetic materials namely, titanium dioxide (TiO$_2$), alumina (Al$_2$O$_3$), rhutanium oxide (RuO), strontium oxide (SrO), zinc oxide (ZnO), magnesium oxide (MgO), zirconium dioxide (ZrO$_2$), Ti, Ta, Ru, Mg, chromium (Cr), niobium (Nb), or nickel niobium (NiNb). Laminate layers 76 and 78 decrease the overall demagnetizing field of free layer 79 and thereby the switching current, making it suitable and advantageous for use in lower cost and higher density memory product. Together, oxidized region 71, oxidized region 83, and laminate layer 72 lower the overall demagnetizing field of the free layer 89, making STT-MRAM element 80 an advantageous alternative to STTM-RAM element 10, shown in FIG. 2, in certain devices.

In some embodiments of the present invention, non-magnetic insulating layer 73 are identical to non-magnetic insulating layer 27 of STTMRAM element 10 of FIG. 2 with regards to composition, thickness, and function.

Figure 8:
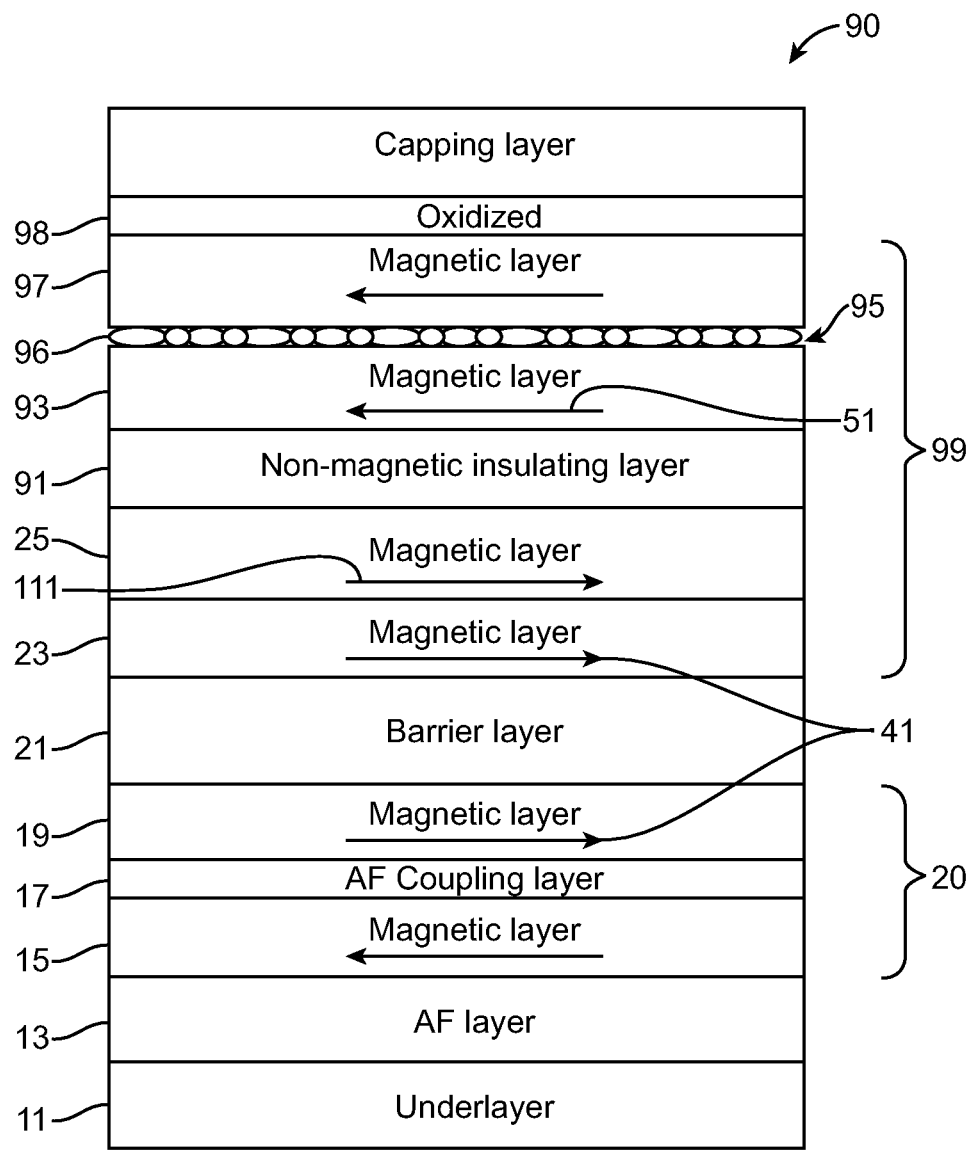
FIG. 8 shows a STTMRAM element with a partially oxidized and laminated synthetic free layer 99, in accordance with an alternative embodiment of the present invention.

Referring now to FIG. 8, STTMRAM element 90 is shown with a partially oxidized and laminated free layer 99, in accordance with an embodiment of the present invention. The underlayer 11, anti-ferromagnetic layer 13, fixed layer 20 (comprising magnetic layer 15, anti-ferromagnetic coupling layer 17, and magnetic layer 19), barrier layer 21, magnetic layer 23, and magnetic layer 25 of MTJ 90 are substantially identical to the same corresponding layers of STTMRAM element 10. STTMRAM element 90 differs from STTM-RAM element 10 in the configuration of its free layer 99.

Free layer 99 comprises magnetic layer 23, magnetic layer 25, non-magnetic insulating layer 91, magnetic layer 93, laminate layer 95, magnetic layer 97, and oxidized region 98. In accordance with some embodiment of the present invention, non-magnetic insulating layer 91 of STTMRAM element 90 is substantially identical to non-magnetic insulating layer 73 of STTMRAM element 70; laminate layer 95 of STTMRAM element 90 is substantially identical to laminate layer 72 of STTMRAM element 70; and magnetic layer 97 of STTMRAM element 90 is substantially identical to magnetic layer 81 of STTMRAM element 80.

Magnetic layer 23 is formed upon barrier layer 21, and upon magnetic layer 23 is formed magnetic layer 25, upon which is formed non-magnetic insulating layer 91, upon which is formed magnetic layer 93, upon which is formed laminate layer 95, upon which is formed magnetic layer 97, upon which is formed oxidized region 98, upon which is formed capping layer 31.

The magnetic layers 93 and 97 of free layer 99 perform the same magnetic field balancing function of magnetic layer 29 of free layer 28 of STTMRAM element 10. As shown in FIG. 7, magnetic layers 93 and 97 share a magnetic orientation (left-pointing arrows). Magnetic layers 23 and 25 also share a magnetic orientation (right-pointing arrows). The magnetic orientation of magnetic layers 23 and 25 is anti-parallel to the magnetic orientation of magnetic layers 93 and 97. The magnitude of the magnetic field generated by magnetic layers 93 and 97 may be equal and opposite to the magnitude of the magnetic field generated by magnetic layers 23 and 35, balancing out for little or no net magnetic field around free layer 99 of STTMRAM element 90. Magnetic layers 93 and 97 may be comprised of substantially the same material used for forming magnetic layer 29.

In some embodiments of the present invention, each of magnetic layers 93 and 97 are substantially of the same thickness as one of the corresponding magnetic layers 23 and 25. Alternatively, each of magnetic layers 93 and 97 are sized to have a thickness not substantially analogous to either of magnetic layer 23 or magnetic layer 25, contributing to each of the magnetic layers of free layer 99 having a different $M_s$.

In accordance with a method of the present invention, the process of manufacturing the relevant layers of free layer 99 of MTJ 90 proceeds as follows: After deposition of magnetic layer 93 upon non-magnetic insulating layer 91, laminate layer 95 may be deposited upon magnetic layer 93, upon which may be deposited magnetic layer 97, the uncovered magnetic layer 97 may then be temporarily exposed to an oxidizing gas which oxidizes an upper portion of magnetic layer 97, forming oxidized region 98.

Oxidized region 98 is comprised of the alloy which comprises magnetic layer 25, after being subjected to a reactive oxygen-containing gas.

On top of the magnetic layer 93 is formed laminate layer 96, upon which is formed magnetic layer 97. Laminate layer 95 lowers the overall demagnetizing field of free layer 99, making MTJ 90 suitable and advantageous for use in lower cost and higher density memory products. Together, oxidized region 98 and laminate layer 95 lower the overall demagnetizing field of free layer 99, making MTJ 90 an advantageous alternative to STTMRAM element 10, shown in FIG. 2, in certain devices.

In accordance with an embodiment of the present invention, non-magnetic insulating layer 91 is identical to non-magnetic insulating layer 27 of STTMRAM element 10 of FIG. 2 with regards to composition, thickness, and function.

Figure 9:
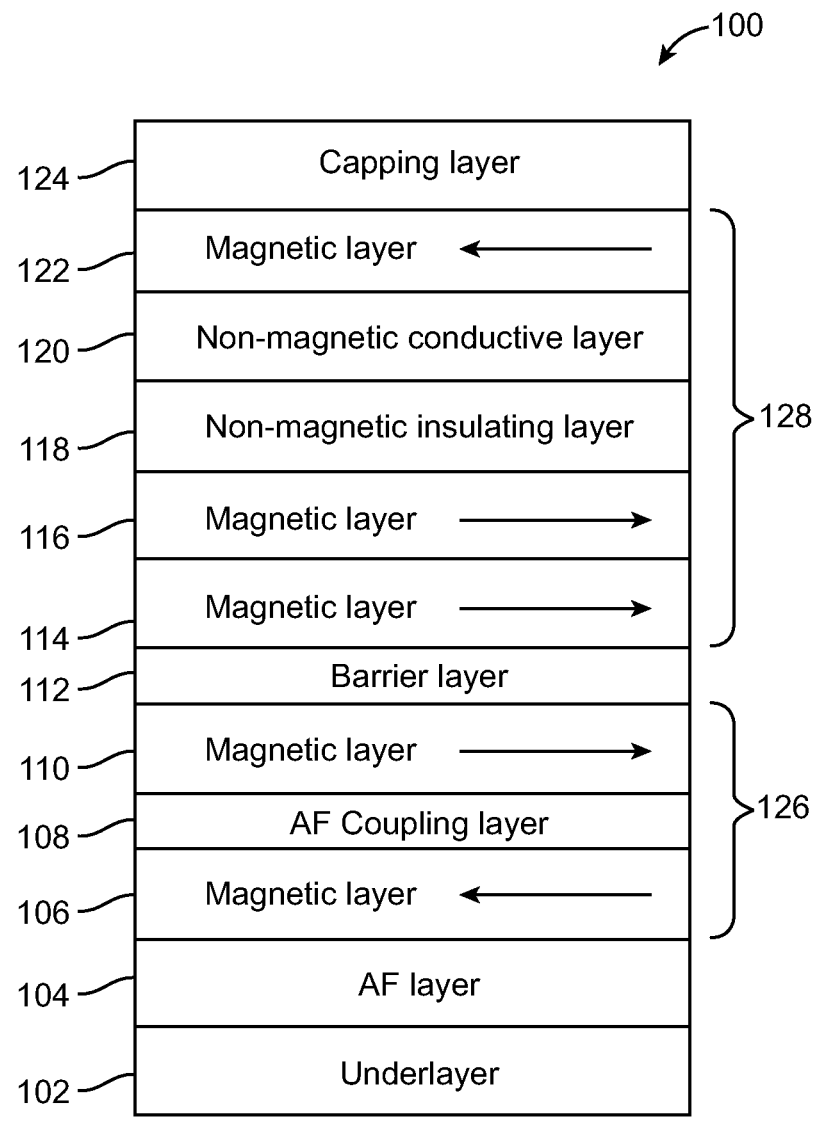
FIG. 9 shows a STTMRAM element 100, in accordance with another embodiment of the present invention.

FIG. 9 shows a STTMRAM element 100, in accordance with another embodiment of the present invention. The element 100 is shown to include an underlayer 102 on top of which is shown formed an anti-ferromagnetic (AF) layer 104, on top of which is shown formed a magnetic layer 106, on top of which is shown formed an AF coupling layer 108, on top of which is shown formed magnetic layer 110, on top of which is shown formed a barrier layer 112, on top of which is shown formed a magnetic layer 114, on top of which is shown formed magnetic layer 116, on top of which is shown formed a non-magnetic insulating layer 118, on top of which is shown formed a non-magnetic conductive layer 120, on top of which is shown formed a magnetic layer 122, on top of which is shown formed capping layer 124. The layers 102, 104, 106, 108, 110, 112, 114, 116, 118 and 124 of the element 100 are analogous to the layers 11, 13, 15, 17, 19, 21, 23, 25, 27 and 31 of the element 10, respectively.

The layer 120 of the element 100 is a layer distinguishing the elements 10 and 100 and in some embodiments is a conductive layer made of one or more of the following materials: Ta, Ru, Ti, Hf, Cu, Zr, Mn, Ir, Pt, Ag, Au, Zn, Pd, W, Nb, Sc, La, Y, Mo, Cr, Re, Ge, Ga, Si, B, N, C, P, Mg, Al. In other embodiments, the layer 120 is a composite conductive layer, made of more than one layer. In such embodiments, the layer 120 is made of one or more of the foregoing materials, i.e. Ta, Ru, Ti, hafnium (Hf), Cu, zirconium (Zr), manganese (Mn), iridium (Ir), platinum (Pt), silver (Ag), gold (Au), zinc (Zn), palladium (Pd), tungsten (W), Nb, scandium (Sc), lanthanum (La), yttrium (Y), molybdenum (Mo), Cr, rhenium (Re), germanium (Ge), gallium (Ga), silicon (Si), B, N, carbon (C), Mg, Al and P. In some embodiments, the layer 120 is composite, conductive and non-magnetic and in such embodiments, it is made of any one of the following materials: Ta, Ru, Ti, Hf, Cu, Zr, Mn, Ir, Pt, Ag, Au, Zn, Pd, W, Nb, Sc, La, Y, Mo, Cr, Re, Ge, Ga, Si, B, N, C, Mg, Al and P, in addition to one or more of the following materials: Co, Fe, or Ni, such as for example CoCr.

The layers 106, 108 and 110 comprise the fixed layer 126 of the element 100 and the layers 114, 116, 118, 120, and 122 comprise the free layer 128. As previously explained regarding other embodiments, the fixed layer 126 has a fixed magnetic orientation after manufacturing of the element 100 whereas the magnetic orientation of the free layer 128 switches relative to that of the layer 126 causing storage of data in the element 100. The layer 112 serves as an insulating layer generating magneto-resistance between the layers 126 and 128.

Alternatively, the position of the layers 118 and 120 are swapped such that the layer 120 is formed on top of the layer 116 and the layer 118 is formed on top of the layer 120 and the layer 122 is formed on top of the layer 118. It is understood that in any of the embodiments of the invention, where a non-magnetic conductive layer is shown and described to be formed on top of a non-magnetic insulating layer, or vice versa, the position of these two layers may be swapped.

Additionally, any of the magnetic layers of the various embodiments of the invention, such as but not limited to the layers 122, 116, 114, 110 and 106 of FIG. 9, are made of a single magnetic layer in some embodiments and in other embodiments, are made of multiple magnetic layers with each magnetic layer having a different composition and in still other embodiments, are made of multiple layers where the layers are interlaced as to the non-magnetic layer and the magnetic layer. As to the latter embodiment, the non-magnetic layer may be formed on top of the magnetic layer and another magnetic layer may be formed on top of the first non-magnetic layer and so on where 'N' number of such bilayers form the magnetic layer. Alternatively, the non-magnetic layer may be formed on top of the magnetic layer.

Figure 10:
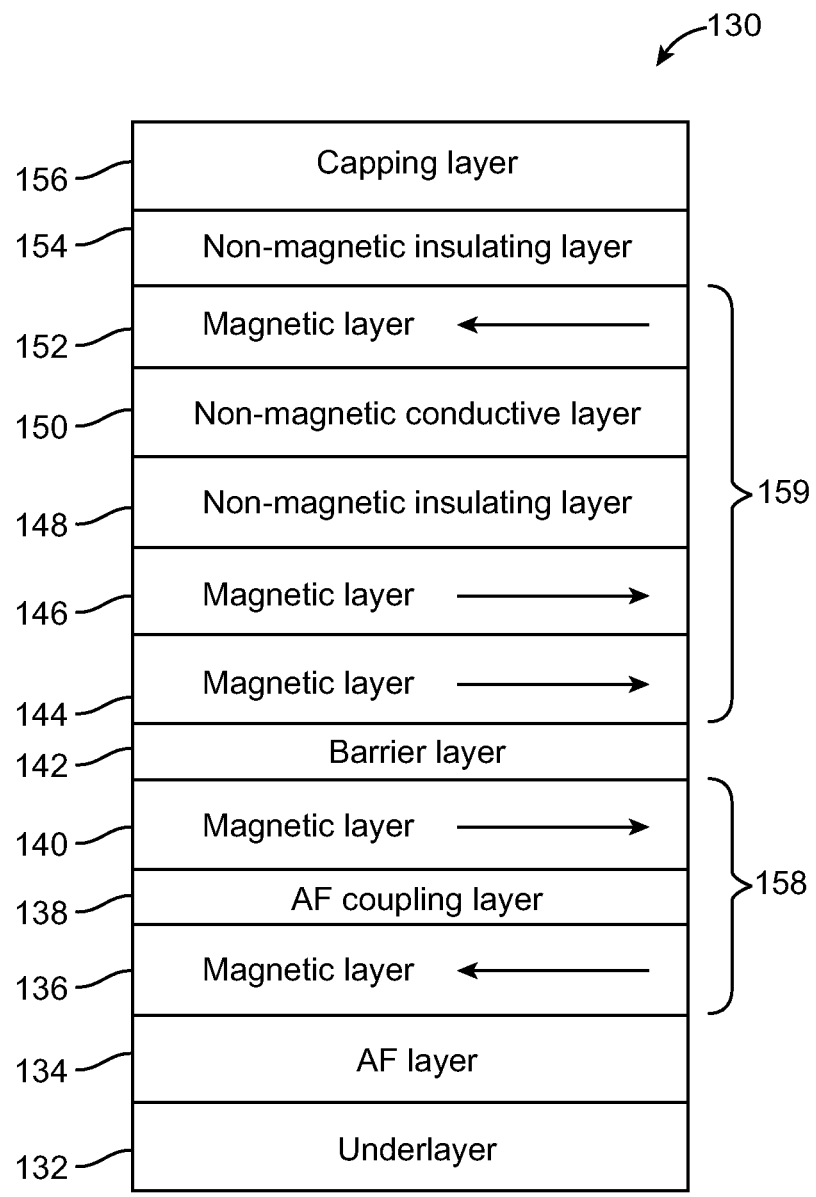
FIG. 10 shows a STTMRAM element 130, in accordance with yet another embodiment of the present invention.

FIG. 10 shows a STTMRAM element 130, in accordance with yet another embodiment of the present invention. The element 130 includes the underlayer 132 on top of which is formed an AF layer 134, on top of which is formed a magnetic layer 136, on top of which is shown formed an AF coupling layer 138, on top of which is shown formed magnetic layer 140, on top of which is shown formed a barrier layer 142, on top of which is shown formed a magnetic layer 144, on top of which is shown formed magnetic layer 146, on top of which is shown formed a non-magnetic insulating layer 148, on top of which is shown formed a non-magnetic conductive layer 150, on top of which is shown formed a magnetic layer 152, on top of which is shown formed a non-magnetic insulating layer 154, on top of which is shown formed a capping layer 156.

The element 130 is analogous to the element 100 except that the element 130 includes an additional non-magnetic insulating layer 154, which is formed between the magnetic layer 152 and the capping layer 156. Stated differently, the layers 132, 134, 136, 138, 140, 142, 146, 148, 150, 152 and 156 of the element 130 are analogous to the layers 102, 104, 106, 108, 110, 112, 116, 118, 120, 122 and 124 of the element 100 except that the layer 154 of the element 130 is an added layer, as compared to the element 100, and is formed on top of the layer 152 and below the layer 156. In some embodiments, the layer 150 is made of the same materials as the layer 120 of the element 100. In some embodiments, the layer 154 of the element 130 is made of material analogous to those that the layer 148 is made of With layer 154, certain properties of the layer 152 can be improved. For example, higher perpendicular anisotropy in layer 154 is realized, which makes switching of free layers of element 130 easier, among other advantages.

The layers 136, 138 and 140 comprise the fixed layer 158 of the element 130 and the layers 144, 146, 148, 150, and 152 comprise the free layer 159 of the element 130. As previously explained regarding other embodiments, the fixed layer 158 has a fixed magnetic orientation after manufacturing of the element 130 whereas the magnetic orientation of the free layer 159 switches relative to that of the layer 158 causing storage of data in the element 130. The layer 142 serves as an insulating layer producing magneto-resistance between the layers 158 and 159.

Figure 11:
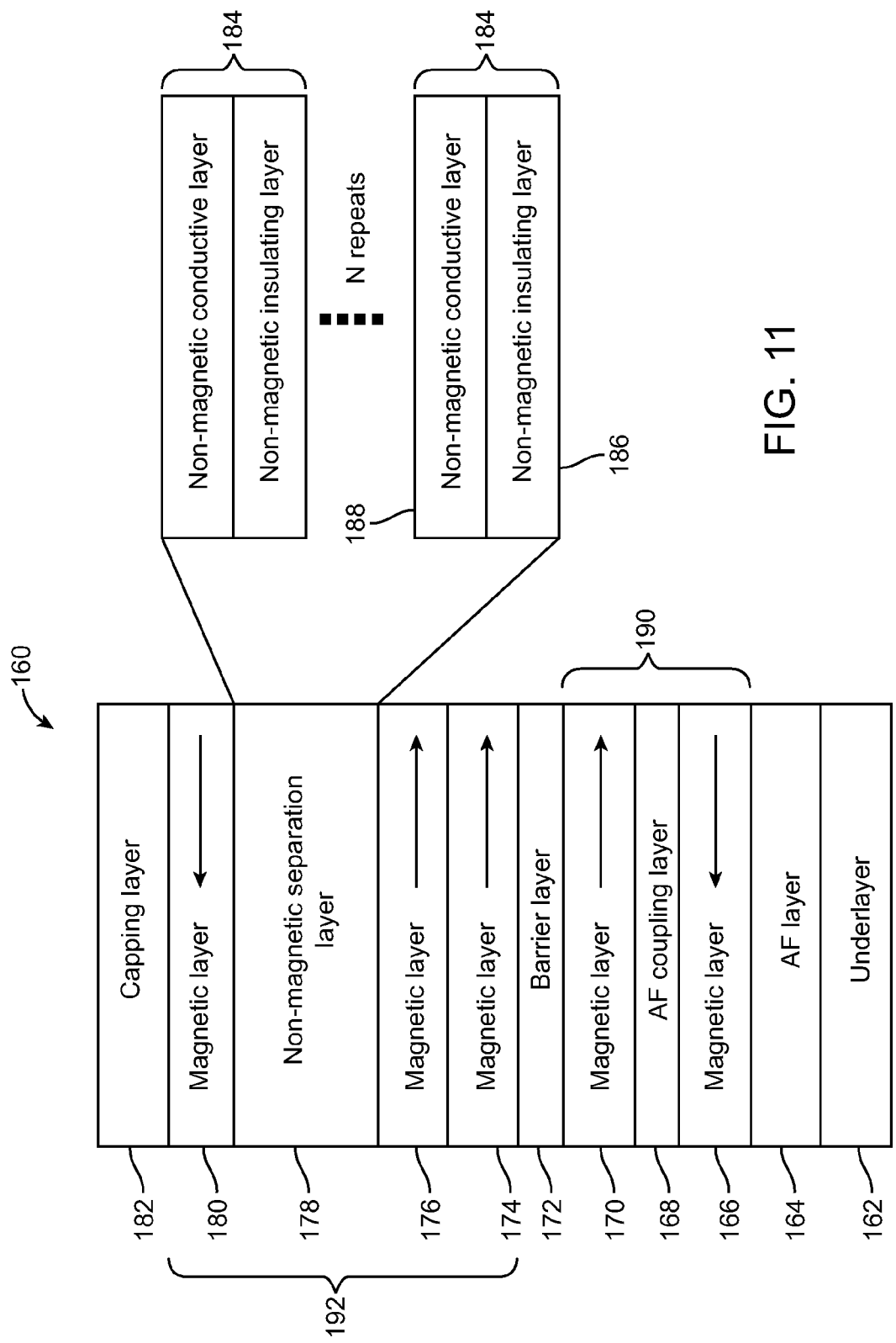
FIG. 11 shows a STTMRAM 160, in accordance with another embodiment of the present invention.

FIG. 11 shows a STTMRAM 160, in accordance with another embodiment of the present invention. The element 160 is shown to include an underlayer 162 on top of which is shown formed an AF layer 164, on top of which is shown formed a magnetic layer 166, on top of which is shown formed an AF coupling layer 168, on top of which is shown formed a magnetic layer 170, on top of which is shown formed a barrier layer 172, on top of which is shown formed a magnetic layer 174, on top of which is shown formed a magnetic layer 176, on top of which is shown formed a non-magnetic separation layer 178, on top of which is shown formed a magnetic layer 180, on top of which is shown formed a capping layer 182. The layers 162, 164, 166, 168, 170, 172, 174, 176, 180 and 182 of the element 160 are analogous to the layers 102, 104, 106, 108, 110, 112, 114, 116, 122 and 182, respectively. The layer 178 is shown to be a composite layer made of more than one layer.

In some embodiments, the layer 178 is made of 'N' number of non-magnetic units 184, 'N' being an integer number of 1 or greater. Each of the units 184 is made of a non-magnetic insulating layer 186 and a non-magnetic conductive layer 188, as shown in FIG. 11. In some embodiments, the layer 188 is formed on top of the layer 186 and in other embodiments, the layer 186 is formed on top of the layer 188. In those embodiments where the layer 188 is formed on top of the layer 186, the layer 186 is formed on top of the layer 176 and the last or top-most layer of the N unit 184, which in these embodiments would be the layer 188 is formed below the layer 180. In those embodiments where the layer 186 is formed on top of the layer 188, the layer 188 is formed on top of the layer 176 and the layer 186 of the top-most N unit 184 is formed below the layer 180. Layer 186 is an insulating layer with composition similar to the layer 188 and the layer 188 has a composition similar to the layer 120 of element 100. Advantage of this multilayer structure is to achieve suitable magnetic isolation between layer 176 and layer 180 while having an easy-to-tune resistivity and lower spin pumping effect that are beneficial for achieving lower switching current of the free layer 192, discussed below.

The layers 166, 168 and 170 comprise the fixed layer 190 of the element 160 and the layers 174, 176, 178, and 180 comprise the free layer 192. [As previously explained regarding other embodiments, the fixed layer 190 has a fixed magnetic orientation after manufacturing of the element 160 whereas the magnetic orientation of the free layer 192 switches relative to that of the layer 190 causing storage of data in the element 160. The layer 172 serves as an insulating layer between the layers 190 and 192.

Figure 12:
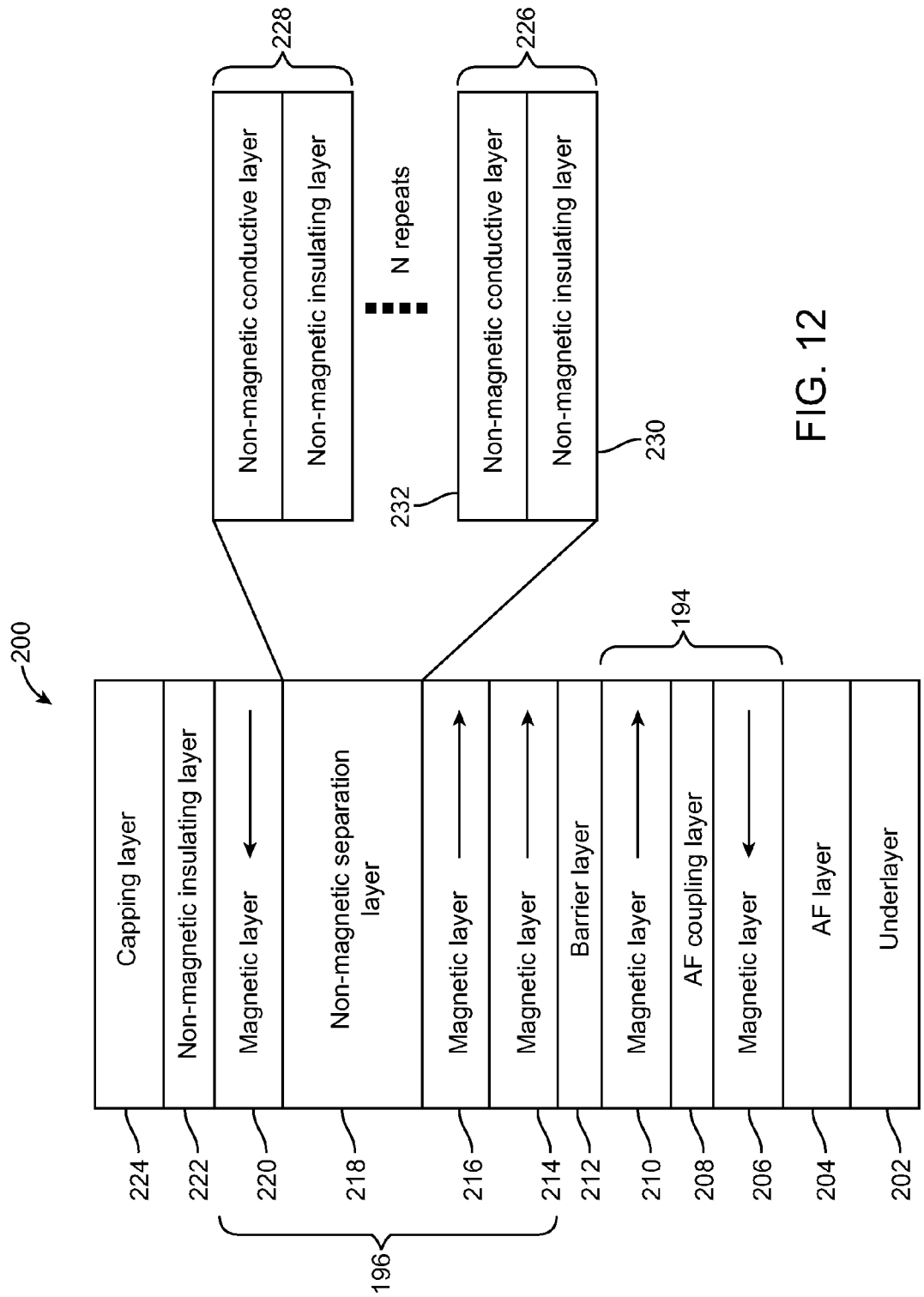
FIG. 12 shows a STTMRAM element 200, in accordance with another embodiment of the present invention.

FIG. 12 shows a STTMRAM element 200, in accordance with another embodiment of the present invention. The element 200 is shown to include an underlayer 202, on top of which is shown formed an AF layer 204, on top of which is shown formed a magnetic layer 206, on top of which is shown formed an AF coupling layer 208, on top of which is shown formed a magnetic layer 210, on top of which is shown formed a barrier layer 212, on top of which is shown formed a magnetic layer 214, on top of which is shown formed a magnetic layer 216, on top of which is shown formed a non-magnetic separation layer 218, on top of which is shown formed a magnetic layer 220, on top of which is shown formed a non-magnetic insulating layer 222, on top of which is shown formed a capping layer 224. The element 200 is analogous to the element 160 except that the layer 222 is added in between the layers 220 and 224, in the element 200. The layer 222 is analogous to the layer 154 of the element 130.

The layers 206, 208 and 210 comprise the fixed layer 194 of the element 200 and the layers 214, 216, 218, 220, and 222 comprise the free layer 196. As previously explained regarding other embodiments, the fixed layer 194 has a fixed magnetic orientation after manufacturing of the element 200 whereas the magnetic orientation of the free layer 196 switches relative to that of the layer 194 causing storage of data in the element 200. The layer 212 serves as an insulating layer producing magneto-resistance between the layers 194 and 196.

Figure 13:
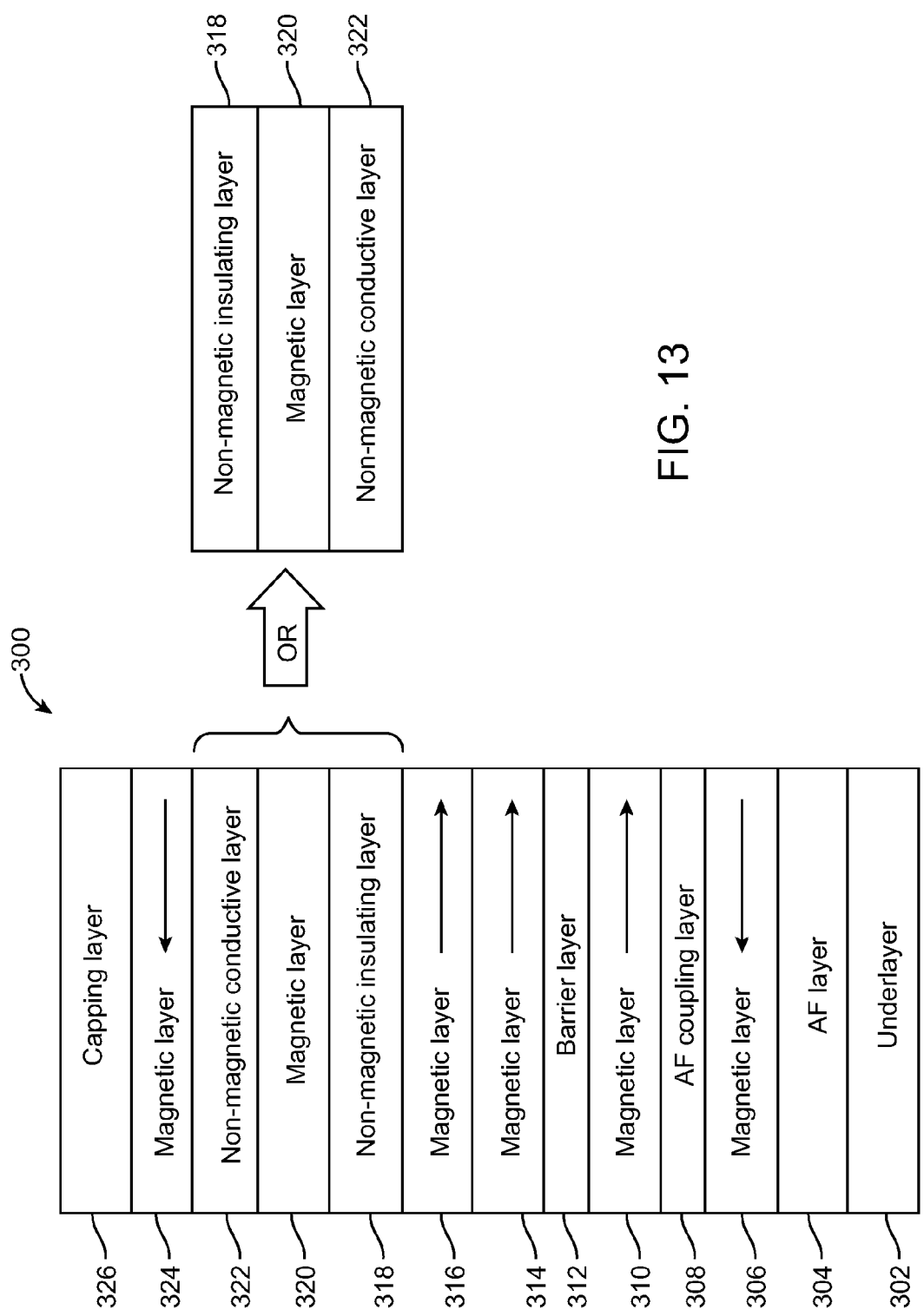
FIG. 13 shows a STTMRAM element 300, in accordance with another embodiment of the present invention.

FIG. 13 shows a STTMRAM element 300, in accordance with another embodiment of the present invention. The element 300 is shown to include an underlayer 302 on top of which is shown formed an anti-ferromagnetic (AF) layer 304 on top of which is shown formed a magnetic layer 306, on top of which is shown formed an AF coupling layer 308, on top of which is shown formed a magnetic layer 310, on top of which is shown formed a barrier layer 312, on top of which is shown formed a magnetic layer 314, on top of which is shown formed a magnetic layer 316, on top of which is shown formed a non-magnetic insulating layer 318, on top of which is shown formed a magnetic layer 320, on top of which is shown formed a non-magnetic conductive layer 322, on top of which is shown formed a magnetic layer 324, on top of which is shown formed a capping layer 326.

In FIG. 13, the layers 306, 308 and 310 comprise the fixed layer of the element 300 and the fixed layer has a permanent or fixed magnetic orientation even when electrical current is applied to the element 300. The layers 314, 316, 318, 320, 322 and 324 comprise the free layer of the element 300 with a switchable magnetic orientation in response to electrical current flowing through the element 300.

The element 300 is analogous to the element 100 except that the magnetic layer 320 in the element 300 is formed between the layers 318 and 322. The layers 318 and 322 are analogous to the layers 118 and 120, respectively, of the element 100. The layer 320, is made of magnetic material, in some embodiments, and is very thin, for example, in an exemplary embodiment, it is less than 0.5 nano meters, which effectively makes it a dead layer with no specific magnetic orientation. However, the presence of the layer 320 helps improve the non-magnetic insulating characteristic of the layer 318, when, for example, layer 318 is made of MgO. The layer 320 may also help reduce spin pumping effect.

Alternatively, the position of the layers 318 and 322 are swapped, as shown in the right side of FIG. 13 where the layer 322 is formed on top of the layer 316, the layer 320 is formed on top of the layer 322 and the layer 318 is formed on top of the layer 320 and the layer 324 is formed on top of the layer 318.

Figure 14:
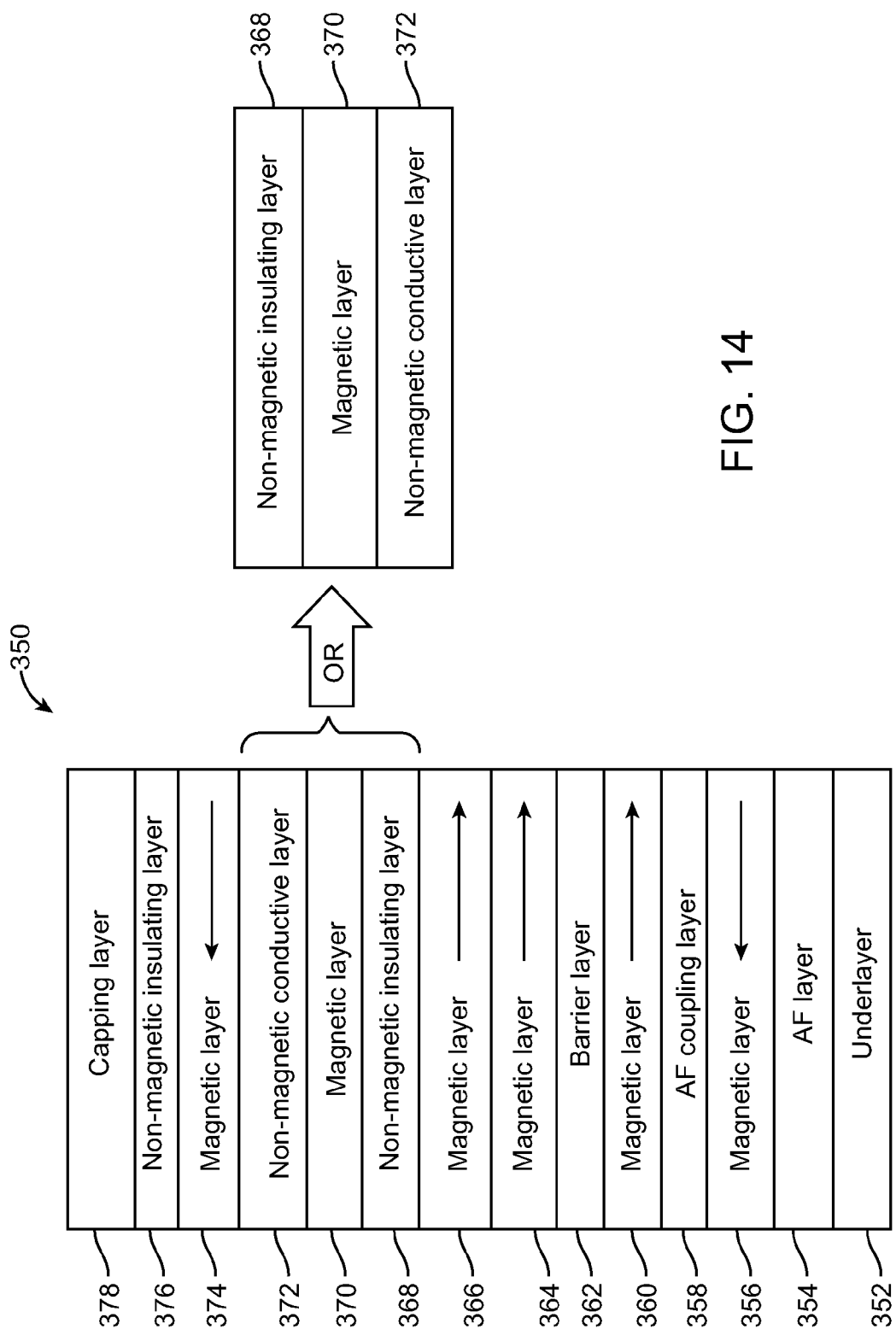
FIG. 14 shows a STTMRAM element 350 in accordance with another embodiment of the present invention.

FIG. 14 shows a STTMRAM element 350 in accordance with another embodiment of the present invention. The element 350 is analogous to the element 130 of FIG. 10 except that a magnetic layer 370 is shown formed between the non-magnetic insulating layer 368 and the non-magnetic conductive layer 372, which are analogous to the layers 148 and 150, respectively, of the element 130. As stated previously, while the layer 370 is made of magnetic material, because it is very thin, in some embodiments less than 0.5 nm, layer 370 is practically magnetically dead. However, in embodiments using the layer 370, the presence of such layer 370 helps improve the non-magnetic insulating layer 368 structure, when, for example, layer 368 is made of MgO. The layer 370 may also help reduce spin pumping effect.

Alternatively, the position of the layers 368 and 372 are swapped, as shown in the right side of FIG. 14 where the layer 372 is formed on top of the magnetic layer 366, the layer 370 is formed on top of the layer 372 and the layer 368 is formed on top of the layer 370 and the magnetic layer 374 is formed on top of the layer 368.

The free layer of the element 350 comprises the layers 364, 366, 368, 370, 372, and 374 and the fixed layer of the element 350 comprises the layers 356, 358 and 360.

The embodiments of FIGS. 2-14 show the various STTMRAM elements being "top structures" where the free layer of the STTMRAM element is shown formed on top of the fixed layer thereof. It is contemplated that in other embodiments, the STTMRAM elements of FIGS. 2-14 can be "bottom structures" with the free layer formed below the fixed layer. For example, with reference to FIG. 9, in an embodiment where the element 100 is a bottom structure, the magnetic layer 122 is formed on top of the layer 102, the layer 120 is formed on top of the layer 122, the layer 118 is formed on top of the layer 120, the layer 116 is formed on top of the layer 118, the layer 114 is formed on top of the layer 116, the layer 112 is formed on top of the layer 114, the layer 110 is formed on top of the layer 112, the layer 108 is formed on top of the layer 110, the layer 106 is formed on top of the layer 108, the layer 104 is formed on top of the layer 106 and the layer 124 is formed on top of the layer 104.

Figure 15:
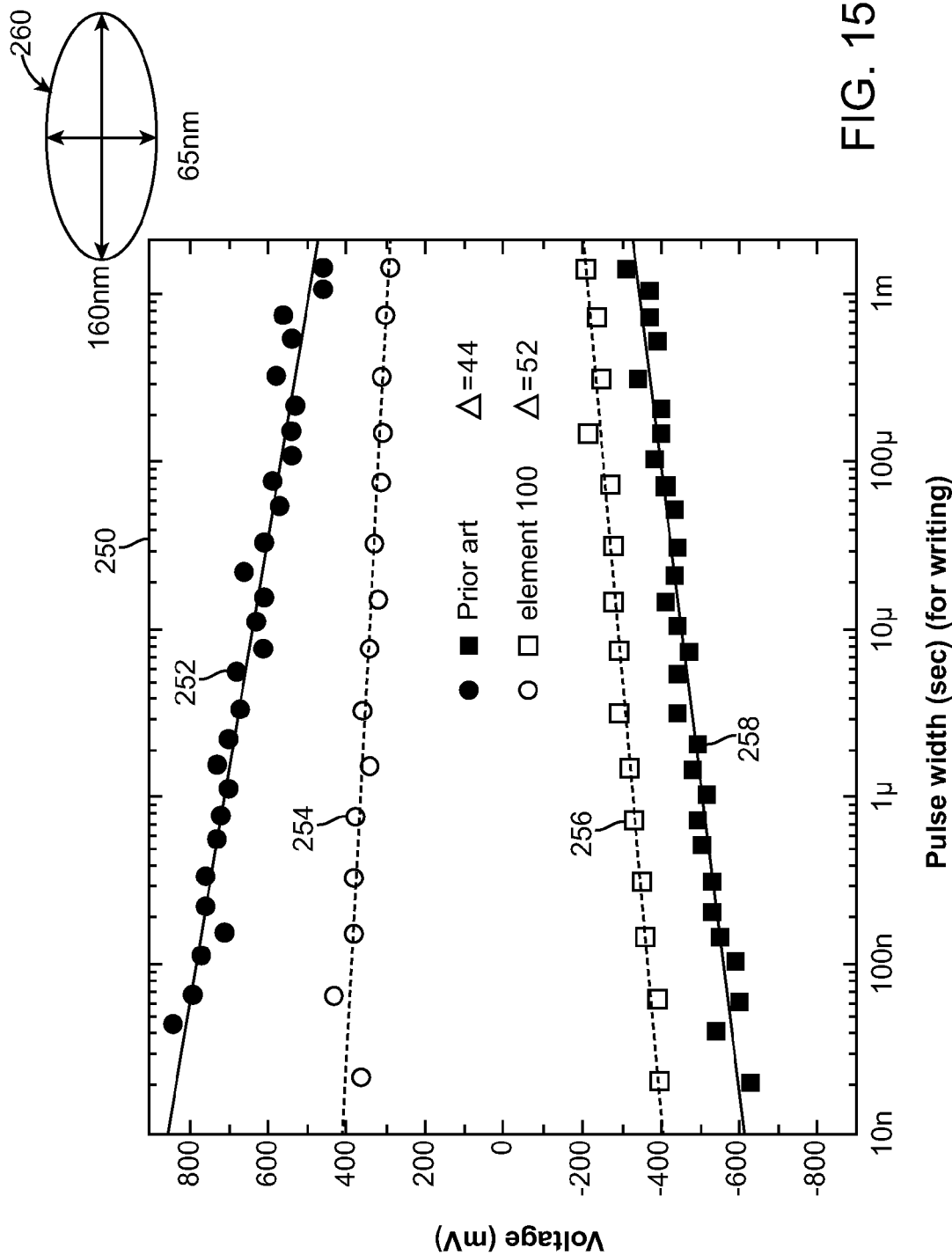
FIG. 15 shows a graph 250 comparing some of the characteristics of the embodiments of FIGS. 9-13 to that of the prior art STTMRAM element 1 of FIG. 1.

FIG. 15 shows a graph 250 comparing some of the empirical characteristics of the embodiments of FIGS. 9-14 to that of the prior art STTMRAM element 1 of FIG. 1. In graph 250, the x-axis represents the pulse width, in seconds, applied to the STTMRAM element when, for example, writing to the STTMRAM element, and the y-axis represents voltage, in milli volts (mV), applied to the STTMRAM element.

The graph 250 includes curves 252 and 258, which each generally show the performance of a prior art STTMRAM element with the curve 252 representing the voltage needed at each pulse width to fully switch a prior art magnetic memory element, such as the element 1 of FIG. 1, from parallel (P) state to anti-parallel (AP) state and the curve 252 being the voltage needed to switch fully from AP state to P state. The curves 254 and 256 each generally show the performance of the STTMRAM elements 100 of FIG. 9. The curve 254 represents the voltage needed to fully switch the state of the element 100 from P state to AP state and the curve 256 represents the voltage needed to switch fully the state of the element 100 from AP state to P state. The size of each of the elements 1 and 100 is presumed to be that which is shown at 260 in FIG. 15, 160 nano meters by 65 nano meters. The thermal stability ($\Delta$) of the prior art element 1 is approximately 44 and that of the element 100 is advantageously approximately 52. As known to those skilled in the art, a measure of thermal stability is defined by $KuV/K_BT$, where Ku represents anisotropy energy density, 'V' represents the volume of the switching (free) layer, $K_B$ represents the Boltzmann constant and 'T' represents absolute temperature. As readily appreciated and accordingly, life expectancy of a magnetic memory element is proportional to $KuV/K_BT$.

Thus, the thermal stability of the element 100 is appreciably higher than that of the element 1. Further, in some embodiments, element 100 requires only 50% of the voltage level required by the prior art element 1 to switch, which makes element 100 advantageous both in terms of thermal stability and ease of switching at a much lower voltage, i.e. consuming less power.

In the above description, use of fixed numbers is no indication of being limited to the fixed numbers. The figures to which reference is made are not drawn to scale and the thickness of the lines is no indication of the size indicated by the lines.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin transfer torque random access memory (STTM-RAM) element capable of switching states when electrical current is applied thereto for storing data, the STTMRAM element comprising:
    an anti-ferromagnetic layer;
    a fixed layer formed on top of the anti-ferromagnetic layer, the fixed layer comprising:
        a first fixed magnetic layer having a first fixed magnetic orientation substantially parallel to the layer plane thereof; and
        a second fixed magnetic layer having a second fixed magnetic orientation substantially parallel to the layer plane thereof;
    a barrier layer formed directly on top of the second fixed magnetic layer;
    a free layer including:
        a first free magnetic layer formed directly on top of the barrier layer and having associated therewith a first saturation magnetization (Ms), the first free magnetic layer having a first switchable magnetic orientation substantially parallel to the layer plane thereof;
        a second free magnetic layer formed on top of the first free magnetic layer and having associated therewith a second Ms, the second free magnetic layer having a second switchable magnetic orientation substantially parallel to the layer plane thereof;
        a non-magnetic insulating layer formed on top of the second free magnetic layer; and
        a third free magnetic layer formed on top of the non-magnetic insulating layer, the third free magnetic layer having a third switchable magnetic orientation substantially parallel to the layer plane thereof;
        wherein the first Ms of the first free magnetic layer is higher than the second Ms of the second free magnetic layer, the first and second switchable magnetic orientations have substantially the same direction that is substantially opposite to the third switchable magnetic orientation; and
    a capping layer formed directly on top of the third free magnetic layer,
    wherein the first fixed magnetic layer is made of a material comprising: silicon dioxide (SiO2), titanium dioxide (TiO$_2$), tantalum oxide (Ta$_2$O$_5$), aluminum oxide (Al$_2$O$_3$), or any combination thereof.

2. The STTMRAM element of claim 1, wherein the first fixed magnetic layer is formed on top of the anti-ferromagnetic layer, and the fixed layer further includes,
    an anti-ferromagnetic coupling layer formed on top of the first fixed magnetic layer and configured to assist in making the magnetic orientation of the first fixed magnetic layer fixed, and wherein the second fixed magnetic layer is formed on top of the anti-ferromagnetic coupling layer of the fixed layer, the anti-ferromagnetic coupling layer further configured to make the magnetic orientation of the second fixed magnetic layer fixed, wherein the first fixed magnetic layer and the second fixed magnetic layer have opposing magnetic orientations.

3. The STTMRAM element of claim 1, wherein the first, second and third free magnetic layers are each made of a material selected from a group consisting of iron (Fe), nickel (Ni), cobalt (Co), platinum (Pt), copper (Cu), boron (B), tantalum (Ta), titanium (Ti), chromium (Cr), terbium (Tb), samarium (Sm), neodymium (Nd), gadolinium (Gd), titanium dioxide (TiO$_2$), magnesium oxide (MgO), tantalum oxide (Ta$_2$O$_5$), aluminum oxide (Al$_2$O$_3$), and any combination thereof.

4. The STTMRAM element of claim 1, wherein the first, second and third free magnetic layers are each made of alloys of cobolt-iron-boron (CoFeB).

5. The STTMRAM element of claim 1, wherein the first and second free magnetic layers are made of different material.

6. The STTMRAM element of claim 1, wherein the first and second free magnetic layers have different thicknesses.

7. The STTMRAM element of claim 1, wherein the anti-ferromagnetic layer is configured to make the magnetic orientation of the fixed layer fixed.

8. The STTMRAM element of claim 1, wherein the free layer further includes a fourth free magnetic layer formed on top of the non-magnetic insulating layer and below the capping layer.

9. The STTMRAM element of claim 8, wherein the fourth free magnetic layer is made of a material selected from a group consisting of iron (Fe), nickel (Ni), cobalt (Co), platinum (Pt), copper (Cu), boron (B), tantalum (Ta), titanium (Ti), chromium (Cr), terbium (Tb), samarium (Sm), neodymium (Nd), gadolinium (Gd), titanium dioxide (TiO2), magnesium oxide (MgO), tantalum oxide (Ta2O5), aluminum oxide (Al2O3), and any combination thereof.

10. The STTMRAM element of claim 1, further including an underlayer on top of which the anti-ferromagnetic layer is formed.

11. The STTMRAM element of claim 1, wherein the first fixed magnetic layer is formed on top of the anti-ferromagnetic layer and the second fixed magnetic layer is formed on top of the first fixed magnetic layer.

12. The STTMRAM element of claim 1, wherein the fixed layer further includes an anti-ferromagnetic coupling layer separating the first fixed magnetic layer from the second fixed magnetic layer.

13. The STTMRAM element of claim 1, wherein the first fixed magnetic layer has a thickness within the range of 0.5 nano meters (nm) to 5 nm.

14. The STTMRAM element of claim 1, wherein the first fixed magnetic layer and the second fixed magnetic layer are made of substantially the same material.

15. The STTMRAM element of claim 1, wherein the first fixed magnetic layer and the second fixed magnetic layer have substantially the same thickness.

16. A spin transfer torque magnetic random access memory (STTMRAM) element comprising:
    an anti-ferromagnetic layer;
    a magnetic fixed layer formed adjacent to the anti-ferromagnetic layer, the magnetic fixed layer comprising a first invariable magnetic sublayer and a second invariable magnetic sublayer with an anti-ferromagnetic coupling layer interposed therebetween;
    a barrier layer formed adjacent to the magnetic fixed layer opposite to the anti-ferrogmagnetic layer;
    a magnetic free layer comprising a first variable magnetic sublayer, a second variable magnetic sublayer, a non-magnetic insulating sublayer, and a third variable magnetic sublayer formed in sequential order with the first variable magnetic sublayer formed adjacent to the barrier layer opposite to the magnetic fixed layer; and a capping layer formed adjacent to the third variable magnetic sublayer, wherein each of the magnetic sublayers has a magnetic orientation parallel to respective layer plane thereof, the first, the second, and the third variable magnetic sublayers have respectively a first, a second, and a third saturation magnetizations, the first and third saturation magnetizations are higher than the second saturation magnetization.

* * * * *